US008748263B2

(12) United States Patent
Kim et al.

(10) Patent No.: US 8,748,263 B2
(45) Date of Patent: Jun. 10, 2014

(54) METHODS OF FABRICATING A SEMICONDUCTOR DEVICE COMPRISING A CONFORMAL INTERFACIAL LAYER

(75) Inventors: Honggun Kim, Hwaseong-si (KR); ByeongJu Bae, Hwaseong-si (KR); Seung-Heon Lee, Seoul (KR); Mansug Kang, Suwon-si (KR); Eunkee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/546,518

(22) Filed: Jul. 11, 2012

(65) Prior Publication Data

US 2013/0052780 A1    Feb. 28, 2013

(30) Foreign Application Priority Data

Aug. 24, 2011    (KR) .................. 10-2011-0084475

(51) Int. Cl.
*H01L 21/8242*    (2006.01)
*H01L 21/768*    (2006.01)
*H01L 21/02*    (2006.01)

(52) U.S. Cl.
CPC .... *H01L 21/76897* (2013.01); *H01L 21/02164* (2013.01)
USPC ..... 438/259; 257/332; 257/532; 257/E21.657

(58) Field of Classification Search
CPC ................. H01L 21/02164; H01L 21/76897; H01L 21/10876
USPC .................. 257/532, E21.657, 332, E21.658; 438/239, 259
See application file for complete search history.

(56) References Cited

U.S. PATENT DOCUMENTS

| 5,567,661 | A | 10/1996 | Nishio et al. | |
| 6,429,476 | B2 * | 8/2002 | Suzuki et al. | 257/296 |
| 6,844,591 | B1 * | 1/2005 | Tran | 257/330 |
| 6,943,071 | B2 * | 9/2005 | Fazio et al. | 438/201 |
| 7,148,155 | B1 * | 12/2006 | Tarafdar et al. | 438/778 |
| 7,423,318 | B2 * | 9/2008 | Suh | 257/332 |
| 7,598,536 | B2 * | 10/2009 | Choi et al. | 257/121 |
| 7,928,494 | B2 * | 4/2011 | Sakagami et al. | 257/314 |
| 8,105,647 | B2 * | 1/2012 | Lee et al. | 427/248.1 |
| 8,466,067 | B2 * | 6/2013 | Liang et al. | 438/697 |
| 2005/0100670 | A1 | 5/2005 | Dussarrat et al. | |
| 2007/0134433 | A1 | 6/2007 | Dussarrat et al. | |
| 2008/0286926 | A1 * | 11/2008 | Chung | 438/262 |

FOREIGN PATENT DOCUMENTS

KR    10-2005-0060074    6/2005

* cited by examiner

*Primary Examiner* — John C Ingham
(74) *Attorney, Agent, or Firm* — Onello & Mello, LLP

(57) ABSTRACT

In a method of fabricating a semiconductor device, isolation structures are formed in a substrate to define active regions. Conductive structures are formed on the substrate to cross over at least two of the active regions and the isolation structures, the conductive structures extending in a first direction. An interfacial layer is conformally formed on the substrate in contact with the conductive structures. A first insulation layer is provided on the interfacial layer, wherein the first insulation layer is formed using a flowable chemical vapor deposition (CVD) process, and wherein the interfacial layer reduces a tensile stress generated at an interface between the conductive structures and the first insulation layer while the first insulation layer is formed.

14 Claims, 23 Drawing Sheets

METHODS OF FABRICATING A SEMICONDUCTOR DEVICE COMPRISING A CONFORMAL INTERFACIAL LAYER

CROSS-REFERENCE TO RELATED APPLICATIONS

This U.S. non-provisional patent application claims priority under 35 U.S.C. §119 to Korean Patent Application No. 10-2011-0084475, filed on Aug. 24, 2011, the entirety of which is incorporated by reference herein.

BACKGROUND

1. Technical Field

The present disclosure herein relates to semiconductor devices and methods of fabricating the same and, more particularly, to semiconductor devices having fine conductive patterns and methods of fabricating the same.

2. Description of Related Art

Semiconductor devices enjoy widespread use in the electronics industry because of their scalability, multi-functionality, and relatively low fabrication cost. Semiconductor memory devices in particular are suitable for storing and retrieving large amounts of data. Such semiconductor memory devices can generally be categorized as volatile memory devices or nonvolatile memory devices. Volatile memory devices retain data when powered and lose stored data when their power supply is removed. Volatile memory devices may include, for example, dynamic random access memory (DRAM) devices and static random access memory (SRAM) devices. In contrast, nonvolatile memory devices retain stored data even when their power supply is removed. Flash memory devices are a typical example of nonvolatile memory devices.

Highly integrated semiconductor memory devices are increasingly in demand with the rapid development of the electronics industry, and therefore are under continuous development. However, the pressures of increased integration lead to challenges in development. For example, increased integration can lead to limitations in improving photolithography processes for defining fine patterns. That is, limitations are present as a result of further reducing the planar areas that the fine patterns are to occupy.

SUMMARY

Embodiments of the inventive concepts are directed to semiconductor devices and methods of fabricating the same.

In an aspect, a method of fabricating a semiconductor device comprises: forming isolation structures in a substrate to define active regions; forming conductive structures on the substrate to cross over at least two of the active regions and the isolation structures, the conductive structures extending in a first direction; conformally forming an interfacial layer on the substrate in contact with the conductive structures; and forming a first insulation layer on the interfacial layer, wherein the first insulation layer is formed using a flowable chemical vapor deposition (CVD) process, and wherein the interfacial layer reduces a tensile stress generated at an interface between the conductive structures and the first insulation layer while the first insulation layer is formed.

In some embodiments, conformally forming the interfacial layer comprises forming using an atomic layer deposition (ALD) process.

In some embodiments, the atomic layer deposition (ALD) process is performed using a trisilylamine ($(SiH_3)_3N$) material and an oxygen gas as source materials.

In some embodiments, forming the first insulation layer using the flowable chemical vapor deposition (CVD) process includes: forming a flowable insulation layer on the interfacial layer; curing the flowable insulation layer to form a cured insulation layer; and annealing the cured insulation layer.

In some embodiments, the flowable insulation layer is formed to include a silazane ($H_3Si(NHSiH_2)_nNHSiH_3$) material.

In some embodiments, prior to formation of the conductive structures, the method further comprises: forming trenches in the substrate to extend in a second direction intersecting the active regions; and forming buried gate patterns in respective ones of the trenches.

In some embodiments, each of the conductive structures is formed to include a second insulation layer, a barrier pattern, an electrode pattern and a capping pattern sequentially stacked or to include a conductive pattern, a barrier pattern, an electrode pattern and a capping pattern sequentially stacked; and the conductive pattern is electrically connected to the active region between the pair of adjacent buried gate patterns.

In some embodiments, the method further comprises forming impurity regions in the active region positioned at both sides of each of the conductive structures.

In some embodiments, each of the conductive structures is formed to include a gate insulation layer, a gate electrode, a silicide pattern and a capping pattern which are sequentially stacked.

In some embodiments, the method further comprises: patterning the first insulation layer and the interfacial layer to form contact holes exposing the active regions between the conductive structures; and forming contact plugs in respective ones of the contact holes.

In another aspect, a semiconductor device comprises: a substrate having isolation structures that define active regions; conductive structures on the substrate to extend in a first direction crossing over at least two of the active regions and the isolation structures; an interfacial layer in contact with at least sidewall surfaces of the conductive structures; a first insulation layer on the interfacial layer and formed using a flowable chemical vapor deposition (CVD) process; and contact plugs penetrating the first insulation layer and the interfacial layer to be electrically connected to the active regions between the conductive structures, wherein the interfacial layer reduces a tensile stress generated from an interface between the conductive structures and the first insulation layer while the first insulation layer is formed.

In some embodiments, the interfacial layer is formed by an atomic layer deposition (ALD) process performed using a trisilylamine ($(SiH_3)_3N$) material and an oxygen gas as source materials.

In some embodiments, the first insulation layer is formed by curing and annealing a flowable insulation layer containing silazane ($H_3Si(NHSiH_2)_nNHSiH_3$).

In some embodiments, the device further comprises buried gate patterns disposed in the substrate to extend in a second direction intersecting the active regions, wherein each of the conductive structures includes a second insulation layer, a barrier pattern, an electrode pattern and a capping pattern sequentially stacked or a conductive pattern, a barrier pattern, an electrode pattern and a capping pattern sequentially stacked; and wherein the conductive pattern is electrically connected to the active region between the pair of adjacent buried gate patterns.

In some embodiments, the device further comprises impurity regions in the active region positioned at both sides of each of the conductive structures, wherein each of the conductive structures includes a gate insulation layer, a gate electrode, a silicide pattern and a capping pattern which are sequentially stacked.

In another aspect, a method of fabricating a semiconductor device comprises: defining active regions in a substrate; forming conductive structures on the substrate that extend, in a first direction, across at least two of the active regions; conformally forming an interfacial layer in contact with the conductive structures; forming a first insulation layer on the interfacial layer, wherein the first insulation layer is formed using a flowable material; and treating the first insulation layer to increase a density of the first insulation layer with the interfacial layer present between the first insulation layer and the conductive structure.

In some embodiments, during treating the first insulation layer, the interfacial layer reduces a tensile stress generated at an interface between the conductive structures and the first insulation layer while the first insulation layer is formed.

In some embodiments, the interfacial layer reduces a tensile stress generated at an interface between the conductive structures and the first insulation layer while the first insulation layer is formed.

In some embodiments, treating the first insulation layer comprises curing and then annealing the first insulation layer.

In some embodiments, conformally forming the interfacial layer comprises forming using an atomic layer deposition (ALD) process; and forming the first insulation material is performed using a flowable chemical vapor deposition (CVD) process.

BRIEF DESCRIPTION OF THE DRAWINGS

Exemplary embodiments in accordance with principles of inventive concepts will be more clearly understood from the following brief description taken in conjunction with the accompanying drawings. The accompanying drawings represent non-limiting, exemplary embodiments as described herein.

DETAILED DESCRIPTION OF EMBODIMENTS

Figure 1:
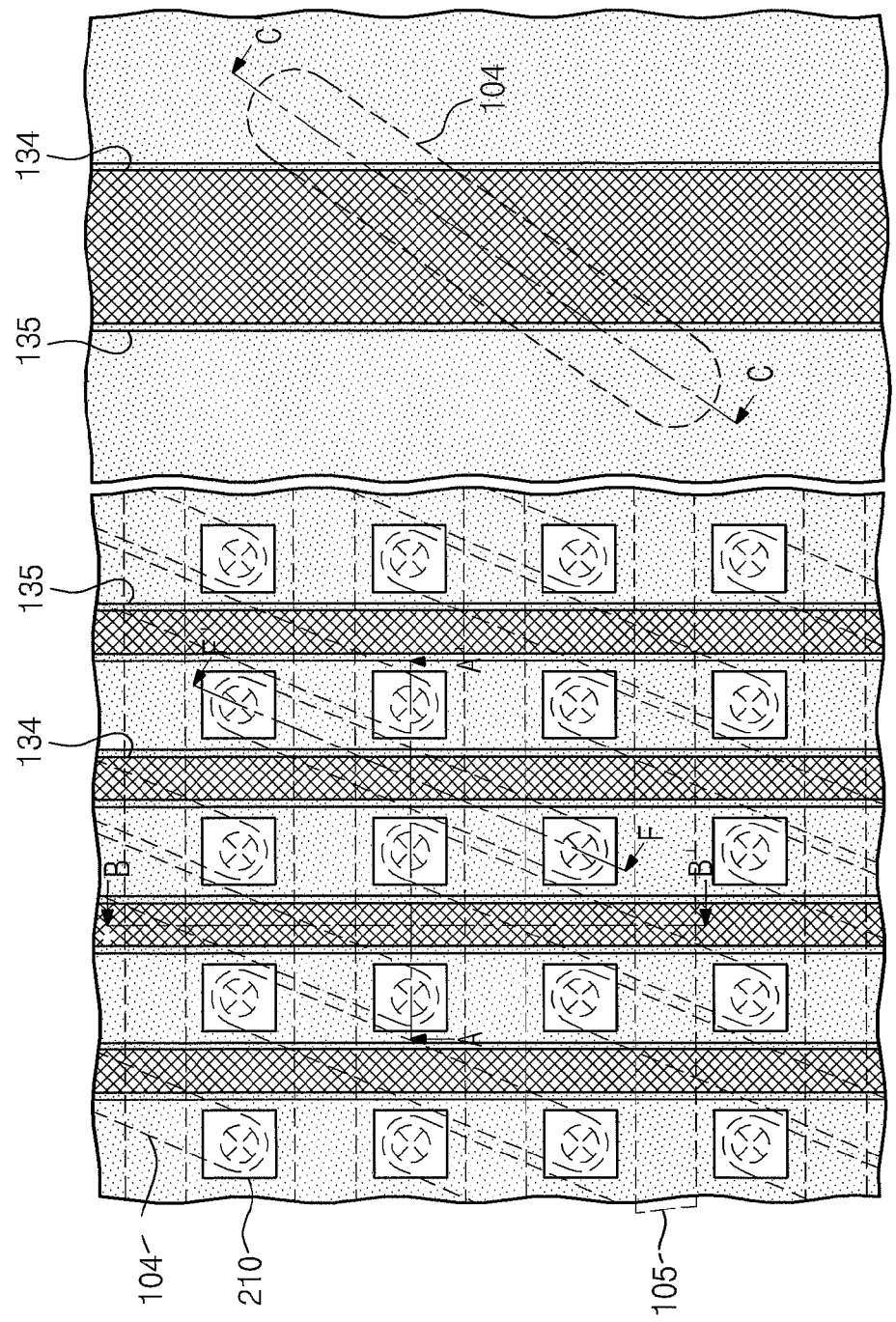
FIG. 1 is a plan view illustrating a semiconductor device according to an embodiment.

The inventive concepts will now be described more fully hereinafter with reference to the accompanying drawings, in which exemplary embodiments of the inventive concept are shown. It should be noted, however, that the inventive concepts are not limited to the following exemplary embodiments, and may be implemented in various different forms. Rather, these embodiments are provided so that this disclosure will be thorough and complete, and will fully convey the scope of the inventive concepts to those skilled in the art. Accordingly, the exemplary embodiments are provided only to disclose the inventive concepts and let those skilled in the art know the category of the inventive concept. The same reference numerals or the same reference designators denote the same elements throughout the specification.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof. In addition, it will be understood that when an element such as a layer, region or substrate is referred to as being "on" or "connected (or coupled) to" another element, it can be directly on or connected (or coupled) to the other element or intervening elements may be present. In contrast, the terms "directly on" "directly connected," or "directly coupled" mean that there are no intervening elements. Similarly, it will be understood that when an element such as a layer, region or substrate is referred to as being "between" two different elements, it can be directly interposed between the two different elements without any intervening element or intervening elements may be present therebetween. In contrast, the term "directly between" means that there are no intervening elements.

Moreover, it will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of the present inventive concepts explained and illustrated herein include their complementary counterparts.

Example embodiments of the inventive concepts are described herein with reference to cross-sectional illustrations and/or planar illustrations that are schematic illustrations of idealized embodiments (and intermediate structures) of example embodiments. In the drawings, thicknesses of layers and regions are exaggerated for clarity. As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an etched region illustrated as a rectangle may have rounded or curved features. Thus, the regions illustrated in the figures are schematic in nature and their shapes are not intended to illustrate the actual shape of a region of a device and are not intended to limit the scope of example embodiments.

Figure 2A:
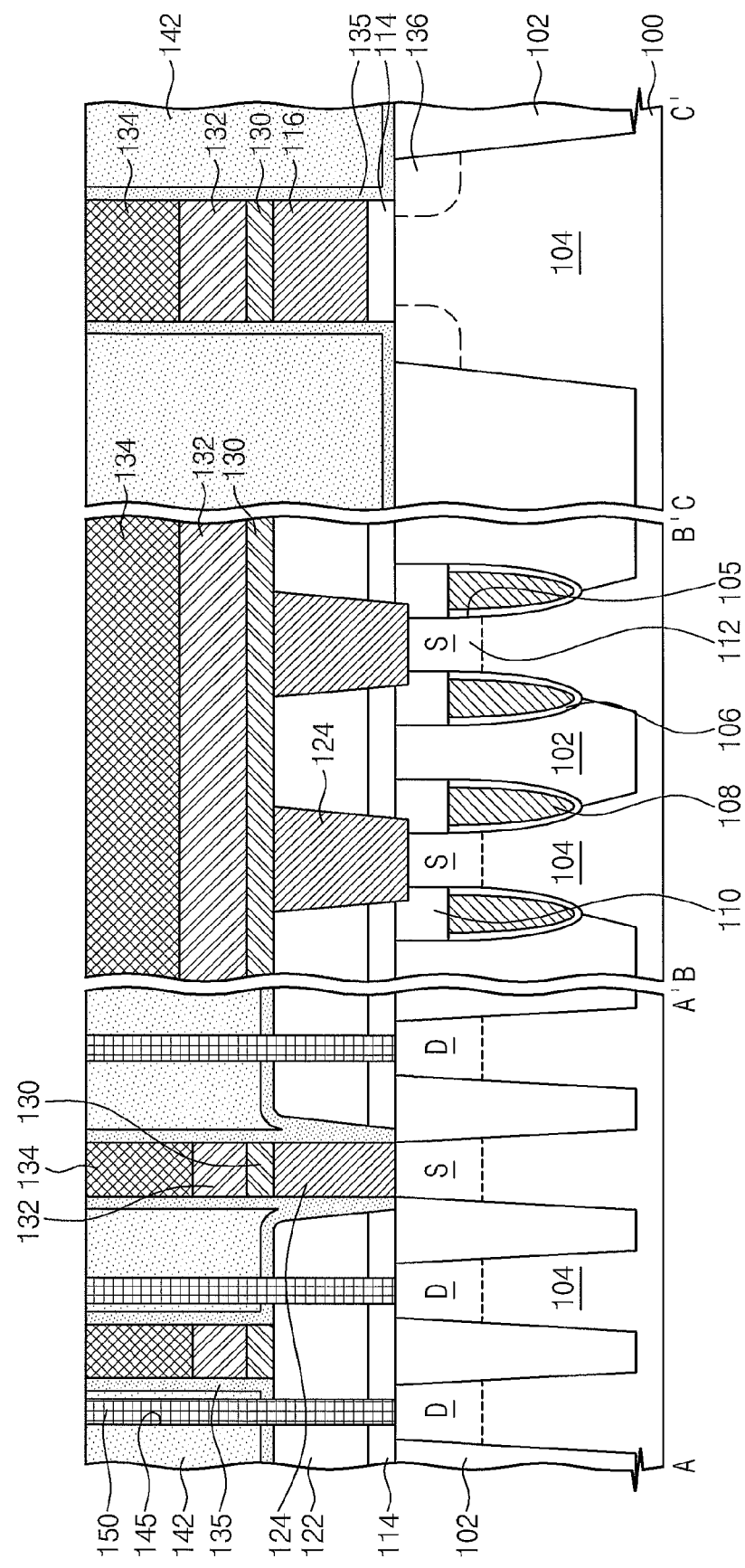
FIG. 2A is a merged cross sectional view taken along lines A-A', B-B' and C-C' of FIG. 1 to illustrate a semiconductor device according to an embodiment.
Figure 2B:
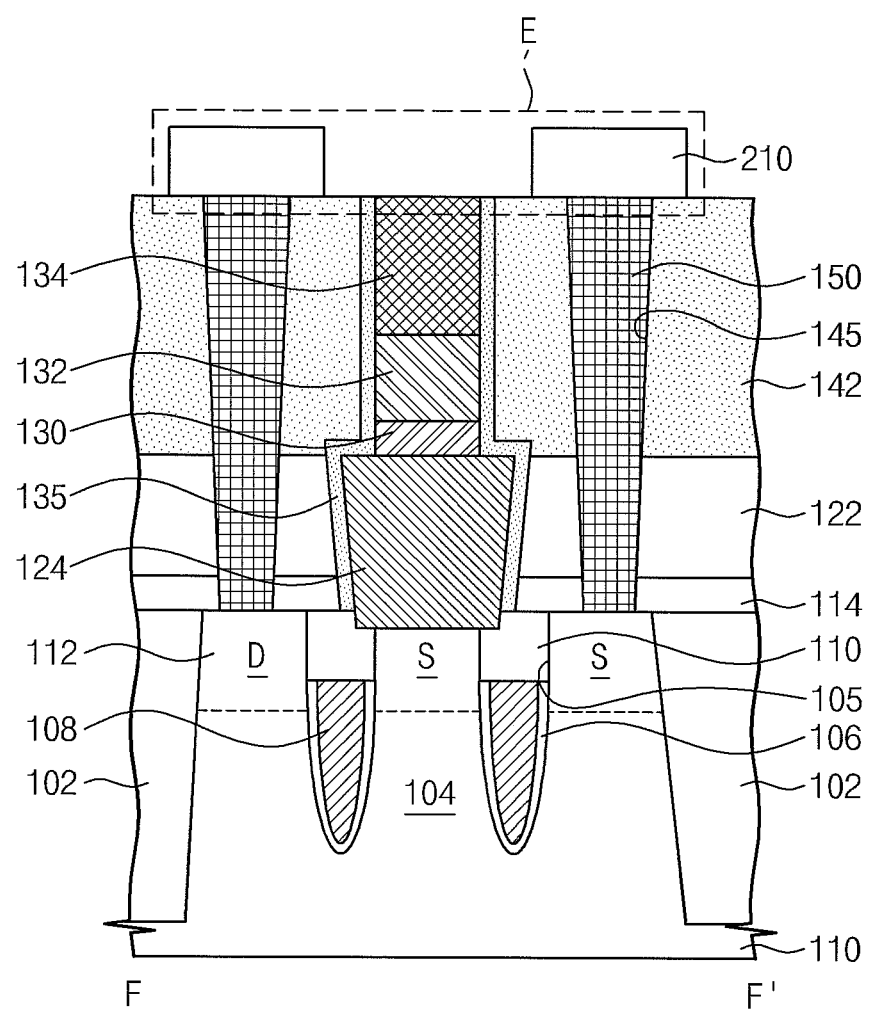
FIG. 2B is a cross sectional view taken along a line F-F' of FIG. 1 to illustrate a semiconductor device according to an embodiment.

FIG. 1 is a plan view illustrating a semiconductor device according to an embodiment. FIG. 2A is a merged cross sectional view taken along lines A-A', B-B' and C-C' of FIG. 1 to illustrate a semiconductor device according to an embodiment, and FIG. 2B is a cross sectional view taken along a line F-F' of FIG. 1 to illustrate a semiconductor device according to an embodiment. For the purpose of convenience in explanation, cross-sections A-A', B-B', C-C' and F-F' may be referred to as A, B, C and F, respectively.

Referring to FIGS. 1, 2A and 2B, a substrate 100 may have a cell region and a peripheral circuit region. The cell region may include regions A, B and F, and the peripheral circuit region may include a region C. Buried channel array transistors may be disposed in the cell region A, B and F, and non-buried, for example, planar, channel array transistors may be disposed in the peripheral circuit region C.

An isolation layer 102 may be disposed in the substrate 100 to define active regions 104 separated by the isolation layer 102. In some embodiments, the isolation layer 102 can comprise a shallow trench isolation layer. However, the form of the isolation layer 102 is not limited to such the shallow trench isolation layer. The isolation layer 102 may include an insulation material. For example, the isolation layer 102 may include at least one of a silicon oxide layer, a silicon nitride layer and a silicon oxynitride layer. The substrate 100 may include a semiconductor material. For example, the substrate 100 may include at least one of a silicon material and a germanium material, or other suitable substrate material.

A plurality of trenches 105 may be disposed in the substrate 100 of the cell region A, B and F. As illustrated in FIGS. 1, 2A and 2B, the trenches 105 may extend in a first direction to have line shapes that cross the active regions 104 and the isolation layer 102 in a plan view. According to an exemplary embodiment, each of the active regions 104 may intersect a pair of trenches 105 of the plurality of trenches 105.

Cell gate electrodes 108 may be disposed in respective ones of the trenches 105. Each of the cell gate electrodes 108 may have a line shape crossing the active regions 104 and the isolation layer 102 in a plan view. Top surfaces of the cell gate electrodes 108 may be located at a lower level than a top surface of the substrate 100. Thus, the cell gate electrodes 108 may be buried, or recessed, in respective ones of the trenches 105.

According to an exemplary embodiment, each of the active regions 104 may intersect the pair of trenches 105 as illustrated in FIG. 1. Thus, each of the active regions 104 may also intersect the pair of cell gate electrodes 108. Each of the cell gate electrodes 108 may include a conductive material. For example, each of the cell gate electrodes 108 may include at least one of a doped semiconductor material, a conductive metal nitride material (e.g., a titanium nitride (TiN) layer, a tantalum nitride (TaN) layer or a tungsten nitride (WN) layer) and a metal material (e.g., a ruthenium (Ru) layer, an iridium (Ir) layer, a titanium (Ti) layer, a tungsten (W) layer or a tantalum (Ta) layer), or other suitable conductive material.

A cell gate insulation layer 106 may be disposed between the cell gate electrodes 108 and inner surfaces of the trenches 105. The cell gate insulation layer 106 may include at least one of an oxide material, a nitride material, an oxynitride material, and a high-k dielectric material, or other suitable insulating material. The high-k dielectric material may correspond to an insulation material having a dielectric constant which is higher than that of the nitride material. For example, the high-k dielectric material may include at least one of insulating metal oxide layers such as a hafnium oxide layer and an aluminum oxide layer. According to an exemplary embodiment, the cell gate insulation layer 106 in each of the trenches 105 may have a U-shaped configuration, or parabolic configuration, in a cross sectional view.

Cell gate capping patterns 110 may be disposed on respective ones of the cell gate electrodes 108. The cell gate capping patterns 110 may fill the trenches 105 on the cell gate electrodes 108. Each of the cell gate capping patterns 110 may include an insulation material. For example, each of the cell gate capping patterns 110 may include at least one of an oxide material, a nitride material and an oxynitride material, or other suitable insulating material.

Cell impurity regions 112 may be disposed in the active regions 104 located at both sides of each of the trenches 105. The cell impurity regions 112 may correspond to source/drain regions S and D. According to an exemplary embodiment, a single common source region S and a pair of drain regions D may be disposed in each of the active regions 104. In each of the active regions 104, the common source region S may be disposed between the pair of cell gate electrodes 108, and the pair of drain regions D may be disposed at both end regions of the active region 104, respectively. That is, one of the pair of cell gate electrodes 108 may be disposed in the active region 104 between the common source region S and one of the pair of drain regions D, and the other of the cell gate electrodes 108 may be disposed in the active region 104 between the common source region S and the other of the pair of drain regions D.

Bottom portions of the cell impurity regions 112 may be located at a position that is at predetermined depth relative to the top surfaces of the active regions 104. In some embodiments, the cell impurity regions 112 may contact sidewalls of the trenches 105. Each of the cell impurity regions 112 may include a region that is doped with impurities. For example, each of the cell impurity regions 112 may include a region that is doped with phosphorus atoms or boron atoms. According to an exemplary embodiment, the bottom surfaces of the cell impurity regions 112 may be located at a higher level than bottom surfaces of the trenches 105.

In some embodiments, a peripheral gate insulation layer 114 may be disposed on an entire top surface of the substrate 100. The peripheral gate insulation layer 114 may include at least one of an oxide material, a nitride material, an oxynitride material and a high-k dielectric material, or other suitable insulation material. The high-k dielectric material may correspond to an insulation material having a dielectric constant which is higher than that of the nitride material. For example, the high-k dielectric material may include at least one of insulating metal oxide layers such as a hafnium oxide layer and an aluminum oxide layer.

A peripheral gate electrode 116 may be disposed on the peripheral gate insulation layer 114 opposite to the active region 104 in the peripheral circuit region C. The peripheral gate electrode 116 may include at least one of a semiconductor material (e.g., a polysilicon layer), a doped semiconductor material, a conductive metal nitride material (e.g., a titanium nitride (TiN) layer, a tantalum nitride (TaN) layer or a tungsten nitride (WN) layer) and a metal material (e.g., a ruthenium (Ru) layer, an iridium (Ir) layer, a titanium (Ti) layer, a tungsten (W) layer or a tantalum (Ta) layer), or other material suitable for forming an electrode.

A pair of peripheral circuit impurity regions 136 may be disposed in the active region 104 to be spaced apart from each other. The peripheral gate electrode 116 may be disposed over the active region 104 between the pair of peripheral circuit impurity regions 136. The peripheral circuit impurity regions 136 may correspond to source/drain regions. Bottom portions of the peripheral circuit impurity regions 136 may be located at a predetermined depth relative to the top surface of the active region 104 in the peripheral circuit region C. Each of the peripheral circuit impurity regions 136 may include a region which is doped with impurities. For example, each of the peripheral circuit impurity regions 136 may include a region which is doped with phosphorus atoms or boron atoms. According to an exemplary embodiment, the bottom surfaces of the peripheral circuit impurity regions 136 may be located at a higher level than a bottom surface of the isolation layer 102.

The peripheral gate insulation layer 114 may extend onto the active regions 104, the isolation layer 102 and the cell gate capping patterns 110 which are disposed in the cell region A, B and F. A first insulation layer 122 may be disposed on the peripheral gate insulation layer 114 in the cell region A, B and F. The first insulation layer 122 may have a single layered structure or a multi-layered structure. The first insulation layer 122 may include at least one of an oxide material, a nitride material and an oxynitride material.

First contact plugs 124 may be disposed to penetrate the first insulation layer 122 and the peripheral gate insulation layer 114. The first contact plugs 124 may be electrically connected to respective ones of the active regions between the cell gate electrodes 106. That is, the first contact plugs 124 may be electrically connected to respective ones of the common source regions S. Each of the first contact plugs 124 may include a conductive material. For example, each of the first contact plugs 124 may include at least one of a polysilicon material, a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable conductive material. In some embodiments, each of the first contact plugs 124 may be a polysilicon plug.

Bit line structures may be disposed on the first insulation layer 122 in the cell region A, B and F. Each of the bit line structures may be electrically connected to some of the first contact plugs 124. Each of the bit line structures may include a barrier pattern 130, a conductive pattern 132 and a capping pattern 134 which are sequentially stacked. The bit line structures may extend onto the peripheral gate electrodes 116 and may be electrically connected to the peripheral gate electrodes 116. Each of the bit line structures may extend in a second direction intersecting the first direction parallel with the trenches 105 in the cell region A, B and F to have a line shape, when viewed from a top plan view. In some embodiments, the barrier pattern 130 may include a conductive metal nitride layer (e.g., a titanium nitride (TiN) layer, a tantalum nitride (TaN) layer or a tungsten nitride (WN) layer), and the conductive pattern 132 may include a metal layer (e.g., a ruthenium (Ru) layer, an iridium (Ir) layer, a titanium (Ti) layer, a tungsten (W) layer or a tantalum (Ta) layer) or other suitable conductive material. The capping pattern 134 may include at least one of an oxide material, a nitride material and an oxynitride material.

An interfacial layer 135 may be disposed to cover at least a sidewall of the bit line structures. The interfacial layer 135 may extend to cover a top surface of the first insulation layer 122, sidewalls of the first contact plugs 124 and sidewalls of the peripheral gate electrodes 116. The interfacial layer 135 may include at least one of an oxide material, a nitride material and an oxynitride material, or other suitable material. In some embodiments, the interfacial layer 135 may comprise an oxide layer that is formed by an atomic layer deposition (ALD) process performed using a trisilylamine ((SiH$_3$)$_3$N) material and an oxygen gas as source materials.

A second insulation layer 142 may be disposed on the substrate including the interfacial layer 135. The second insulation layer 142 may be planarized to expose top surfaces of the bit line structures. The second insulation layer 142 may have a single layered structure or a multi-layered structure. The second insulation layer 142 may include at least one of an oxide material, a nitride material and an oxynitride material. Preferably, the second insulation layer 142 may be an oxide layer that is formed by curing and annealing a flowable insulation material.

In a case where the second insulation layer 142 is formed directly on the bit line structures, a strong tensile stress may be generated between the second insulation layer 142 and the bit line structures. In this case, after planarization of the second insulation layer 142, recessed regions or seams exposing some portions of sidewalls of the bit line structures may be formed due to the relatively strong tensile stress. Thus, when second contact plugs 150 are formed of a conductive material during a subsequent processing step, the recessed regions or the seams may be filled with the conductive material. The conductive material thus present in the recessed regions or the seams may serve to operate as an electrical bridge that electrically connects the adjacent second contact plugs 150 to each other. However, according to the embodiments described herein, the interfacial layer 135 may be disposed between the second insulation layer 142 and the bit line structures to remarkably reduce the resulting tensile stress. Thus, a high reliable semiconductor device may be realized without degradation of productivity.

Further, the second insulation layer 142 may be formed of a flowable insulation material, as described above. Thus, the second insulation layer 142 may itself be formed to fill spaces between the bit line structures having a small and fine pitch size without generating any voids. Accordingly, a highly integrated semiconductor device may be realized.

In some embodiments, the aforementioned second contact plugs 150 may be formed or positioned to penetrate the second insulation layer 142, the interfacial layer 135, the first insulation layer 122 and the peripheral gate insulation layer 114. The second contact plugs 150 may be disposed to contact respective ones of the drain regions D.

In some embodiments, each of the second contact plugs 150 may include a conductive material. For example, each of the second contact plugs 150 may include at least one selected from the group consisting of a semiconductor material (e.g., a polysilicon layer), a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable conductive material.

Referring to FIG. 2B, data storage elements 210 may be disposed on the second insulation layer 142. The data storage elements 210 may be electrically connected to respective ones of the second contact plugs 150. The data storage elements 210 may be embodied in various forms.

Figure 3A:
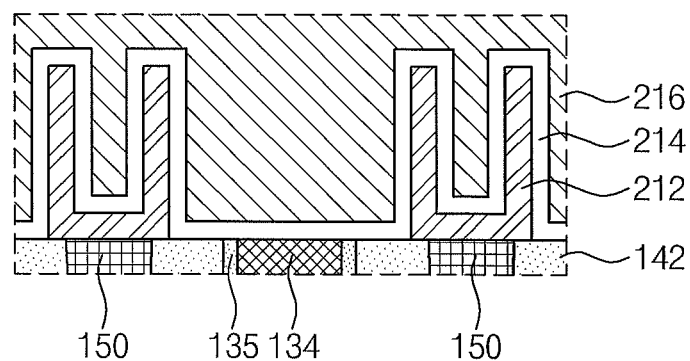
FIGS. 3A and 3B are enlarged views illustrating a portion 'E' of FIG. 2B.
Figure 3B:
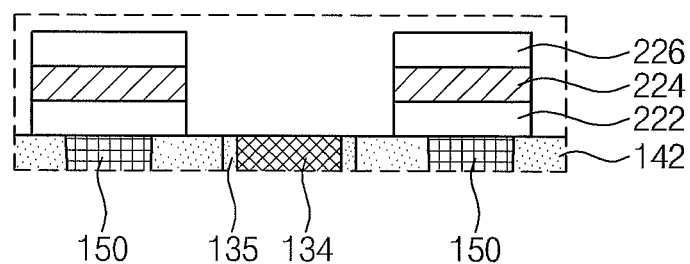

FIGS. 3A and 3B are enlarged views illustrating a portion 'E' of FIG. 2B. FIG. 3A is an enlarged cross sectional view illustrating an example of the data storage element 210 shown in FIG. 2B, and FIG. 3B is an enlarged cross sectional view illustrating another example of the data storage element 210 shown in FIG. 2B.

Referring to FIG. 3A, the data storage element 210 may comprise a capacitor. That is, the data storage element 210 may include a lower electrode (or a storage node) 212. The lower electrode 212 may have a cylindrical shape. That is, the lower electrode 212 may include a planar base portion contacting the second contact plug 150 and a sidewall portion upwardly extending from an edge of the planar base portion. The lower electrode 212 may include a conductive material. For example, the lower electrode 212 may include at least one selected from the group consisting of a doped semiconductor material, a conductive metal nitride material (e.g., a titanium nitride (TiN) material, a tantalum nitride (TaN) material or a tungsten nitride (WN) material), a metal material (e.g., a titanium (Ti) layer, a tungsten (W) layer or a tantalum (Ta) layer), and a conductive metal oxide material (e.g., an iridium oxide ($IrO_2$) material), or other suitable conductive material.

A dielectric layer 214 may be conformally disposed on the lower electrode 212. The dielectric layer 214 may cover an entire surface of the lower electrode 212. Further, the dielectric layer 214 may cover portions of a top surface the second insulation layer 142. The dielectric layer 214 may include at least one of an oxide material, a nitride material, an oxynitride material and a high-k dielectric material, or other suitable material.

An upper electrode 216 may be disposed on the dielectric layer 214 opposite to the lower electrode 212. The upper electrode 216 may include a conductive material. For example, the upper electrode 216 may include at least one selected from the group consisting of a doped semiconductor material, a metal material, a conductive metal nitride material, and a metal silicide material, or other suitable conductive material.

Referring to FIG. 3B, the data storage element 210 may include a variable resistor. The data storage element 210 may include a first electrode 222, a variable resistor 224 and a second electrode 226. The variable resistor 224 may be disposed between the first and second electrodes 222 and 226. Thus, the first electrode 222, the variable resistor 224 and the second electrode 226 may be sequentially stacked.

According to an exemplary embodiment, the variable resistor 224 may include a phase change material. The phase change material may include at least one of chalcogenide materials (e.g., a tellurium (Te) material and a selenium (Se) material). In addition, the phase change material may be a compound material that further includes at least one of germanium (Ge), stibium (Sb), bismuth (Bi), lead (Pb), tin (Sb), silver (Ag), arsenic (As), sulfur (S), silicon (Si), phosphorus (P), oxygen (O) and nitrogen (N). For example, the variable resistor 224 may include at least one of a Ge—Sb—Te material, an As—Sb—Te material, an As—Ge—Sb—Te material, a Sn—Sb—Te material, a Ag—In—Sb—Te material, an In—Sb—Te material, a 5A group element-Sb—Te material, a 6A group element-Sb—Te material, a 5A group element-Sb—Se material, and a 6A group element-Sb—Se material, or other suitable material Each of the first and second electrodes 222 and 226 may include a conductive material having a low reactivity. For example, each of the first and second electrodes 222 and 226 may include a conductive metal nitride material, for example, at least one of a titanium nitride (TiN) layer, a tantalum nitride (TaN) layer and a titanium-aluminum nitride (TiAlN) layer, or other suitable material. According to an exemplary embodiment, the first electrode 222 may be a heating electrode. If a current flows through the first electrode 222, the first electrode 222 may generate heat and the heat may be conducted to the variable resistor 224. If the variable resistor 224 is heated up and cooled down, the variable resistor 224 may be transformed into an amorphous state or a crystalline state. The logical data stored in the data storage element 210 may be determined according to whether the variable resistor 224 has an amorphous state or a crystalline state.

Although not shown in the drawings, the data storage element 210 may further include the data storage element 210 may further include an ohmic layer disposed between the second contact plug 150 and the first electrode 222. The ohmic layer may include a metal-semiconductor compound layer. For example, the ohmic layer may include at least one of a cobalt-semiconductor compound material (e.g., a cobalt silicide (CoSi) layer), a nickel-semiconductor compound material (e.g., a nickel silicide (NiSi) layer), and a titanium-semiconductor compound material (e.g., a titanium silicide (TiSi) layer), or other suitable material According to another exemplary embodiment, the variable resistor 224 may include a transition metal oxide material. For example, the variable resistor 224 may include at least one of a nickel oxide (NiO) layer, a niobium oxide (NbO) layer, a titanium oxide (TiO) layer, a zirconium oxide (ZrO) layer, a hafnium oxide (HfO) layer, a cobalt oxide (CoO) layer, an iron oxide (FeO) layer, a copper oxide (CuO) layer, a chrome oxide (CrO) layer and a combination thereof, or other suitable material.

When the variable resistor 224 includes the transition metal oxide material, each of the first and second electrodes 222 and 226 may include a conductive material. For example, each of the first and second electrodes 222 and 226 may include at least one of an aluminum (Al) layer, a gold (Au) layer, a platinum (Pt) layer, a ruthenium (Ru) layer, an iridium (Ir) layer and a titanium (Ti) layer, or other suitable conductive material. In the event that the variable resistor 224 includes the transition metal oxide material, electrical resistance of the variable resistor 224 may vary according to a voltage applied between the first and second electrodes 222 and 226.

According to yet another exemplary embodiment, the variable resistor 224 may be a magnetic tunnel junction (MTJ) pattern. That is, the variable resistor 224 may include a free layer, a reference layer, and a tunnel barrier layer disposed between the free layer and the reference layer. The magnetic polarization of the free layer may be freely changed according to an external magnetic field. On the contrary, the magnetic polarization of the reference layer may be fixed to have a specific direction even though the external magnetic field is changed.

According to the exemplary embodiments described above, the interfacial layer 135 formed of a flowable insulation material may be disposed between the second insulation layer 142 and the bit line structures. Thus, the interfacial layer 135 may reduce the tensile stress which would otherwise be generated at the interface between the second insulation layer 142 and the bit line structures while the second insulation layer 142 is formed. Accordingly, the interfacial layer 135 may prevent an electrical bridging phenomenon between the second contact plugs 150 which are formed along a direction parallel with the bit line structures. As a result, a high reliability semiconductor device may be realized without degradation of productivity.

FIGS. 4 to 13 are cross-sectional views taken along cross-section line A-A' of FIG. 1 to illustrate a method of fabricating a semiconductor device according to an embodiment.

Figure 4:
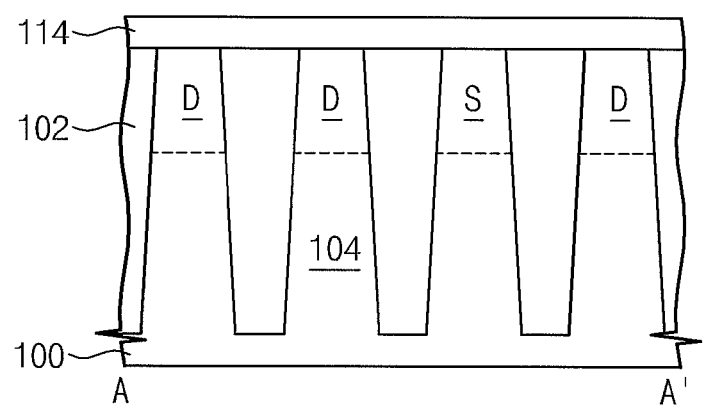
FIGS. 4 to 13 are cross sectional views taken along a line A-A' of FIG. 1 to illustrate a method of fabricating a semiconductor device according to an embodiment.

Referring to FIG. 4, a substrate 100 having an isolation layer 102 may be provided. The isolation layer 102 may define active regions 104. The substrate 100 may include a semiconductor material. For example, the substrate 100 may include at least one of a silicon material and a germanium material, or other suitable substrate material.

The isolation layer 102 may be formed by forming a groove or recess in the substrate 100, forming an insulation layer on the substrate to fill the groove, and etching the insulation layer to expose a top surface of the substrate 100. The isolation layer 102 may include an insulation layer. For example, the isolation layer 102 may be formed to include at least one of an oxide material, a nitride material and an oxynitride material, or other suitable insulative material.

Referring again to FIGS. 1, 2A and 2B, a plurality of trenches 105 may be formed in the substrate 100 of the cell region A, B and F. As illustrated in FIGS. 1, 2A and 2B, the trenches 105 may be formed to extend in a first direction to have line-segment shapes and to cross or intersect the active regions 104 and the isolation layer 102 in a plan view. In some embodiments, each of the active regions 104 may intersect a pair of trenches 105 of the plurality of trenches 105.

The trenches 105 may be formed by forming a mask pattern (not shown) and etching the substrate (e.g., the active regions 104 and the isolation layer 102) using the mask pattern as an etch mask. In some embodiments, the etching process for forming the trenches 105 may include, for example, a dry etching process.

A cell gate insulation layer 106 may be conformally formed on the substrate including the trenches 105. The cell gate insulation layer 106 may be formed using a thermal oxidation process. In a case where the cell gate insulation layer 106 is formed using a thermal oxidation process, the thermal oxidation process may be performed at least once. In other words, the cell gate insulation layer 106 may be formed by performing a single step of thermal oxidation process or by repeatedly performing the thermal oxidation process twice or more.

Alternatively, the cell gate insulation layer 106 may be formed using a chemical vapor deposition (CVD) process or an atomic layer deposition (ALD) process. The cell gate insulation layer 106 may be formed to include at least one of a high-k dielectric material, an oxide material, a nitride material and an oxynitride material. In some embodiments, the high-k dielectric material may correspond to an insulation material having a dielectric constant which is higher than that of the nitride material. For example, the high-k dielectric material may include at least one of insulating metal oxide layers such as a hafnium oxide layer and an aluminum oxide layer, or other suitable insulating material.

A cell gate electrode layer may be formed on the cell gate insulation layer 106. The cell gate electrode layer may be formed to fill at least lower portions of the trenches 105 surrounded by the cell gate insulation layer 106. The cell gate electrode layer may be formed using a physical vapor deposition (PVD) process, a chemical vapor deposition (CVD) process or an atomic layer deposition (ALD) process. The cell gate electrode layer may be formed to include at least one of a doped semiconductor material, a conductive metal nitride material (e.g., a titanium nitride (TiN) material, a tantalum nitride (TaN) material or a tungsten nitride (WN) material), and a metal material (e.g., a ruthenium (Ru) layer, an iridium (Ir) layer, a titanium (Ti) layer, a tungsten (W) layer or a tantalum (Ta) layer), or other material suitable for forming the cell gate electrode layer.

Before the cell gate electrode layer is formed, a surface treatment such as a nitridation treatment or an ozone treatment may be applied to the substrate including the cell gate insulation layer 106. This surface treatment may suppress formation of a contamination layer between the cell gate insulation layer 106 and the cell gate electrode layer while the cell gate electrode layer is formed. Thus, the surface treatment may improve the reliability and the electrical characteristics of the resulting semiconductor device.

The cell gate electrode layer may be etched back to form cell gate electrodes 108. The etch back process may be performed such that top surfaces of the cell gate electrodes 108 are positioned at a vertical position, or level, that is lower than top surfaces of the active regions 104 (or a top surface of the isolation layer 102). Thus, the cell gate electrodes 108 may be formed in respective ones of the trenches 105. The cell gate electrodes 108 may be formed using at least one of a chemical mechanical polishing (CMP) process and a dry etching process. In each of the trenches 105, the cell gate insulation layer 106 may have a parabolic, or U-shaped, cross-sectional view surrounding a sidewall and a bottom surface of the cell gate electrode 108 as illustrated in FIGS. 2A and 2B.

According to an exemplary embodiment, the pair of trenches 105 may cross each of the active regions 104. Thus, the pair of gate electrodes 108 may also intersect each of the active regions 104 in a plan view.

Cell gate capping patterns 110 may be formed on respective ones of the cell gate electrodes 108. The cell gate capping patterns 110 may be formed by forming a cell gate capping layer on an entire surface of the substrate including the cell gate electrodes 108 and etching the cell gate capping layer until top surfaces of the active regions 104 (or a top surface of the isolation layer 102) are exposed. The cell gate capping layer may be formed using a chemical vapor deposition (CVD) process. The etching process for forming the cell gate capping patterns 110 may be performed using at least one of a chemical mechanical polishing (CMP) process, a dry etching process and a wet etching process. The cell gate capping layer may be formed to include an insulation layer. For example, the cell gate capping layer may be formed to include at least one of an oxide layer, a nitride layer and an oxynitride layer, or other suitable insulation layer.

In some embodiments, an insulation layer (not shown) may be formed between the cell gate electrode electrodes 108 and the cell gate capping patterns 110.

Cell impurity regions 112 may be formed in the active regions 104 located at both sides of each of the trenches 105. The cell impurity regions 112 may correspond to source/drain regions. In some embodiments, a single common source region (S of FIG. 2B) and a pair of drain regions (D of FIG. 2B) may be formed in each of the active regions 104. In each of the active regions 104, the common source region S may be formed in the active region 104 between the pair of cell gate electrodes 108, and the pair of drain regions D may be formed in both ends of the active region 104 respectively. That is, one of the pair of cell gate electrodes 108 may be formed in the trench 105 between the common source region S and one of the pair of drain regions D, and the other of the cell gate electrodes 108 may be formed in the trench 105 between the common source region S and the other of the pair of drain regions D.

The cell impurity regions 112 may be formed to have a predetermined depth relative to top surfaces of the active regions 104. The cell impurity regions 112 may be formed to contact sidewalls of the trenches 104. The cell impurity regions 112 may be formed by injecting impurities into the active regions 104. In some embodiments, the impurities injected into the active regions 104 may include phosphorus atoms or boron atoms. In some embodiments, bottom portions of the cell impurity regions 112 may be located at a higher level than bottom surfaces of the trenches 105.

Referring again to FIG. 4, a peripheral circuit gate insulation layer 114 may be formed on an entire surface of the substrate including the cell impurity regions 112. In some embodiments, the peripheral circuit gate insulation layer 114 may be formed to include at least one of an oxide material, a nitride material, an oxynitride material and a high-k dielectric material. The high-k dielectric material may correspond to an insulation material having a dielectric constant which is higher than that of the nitride material. For example, the high-k dielectric material may include at least one of insulating metal oxide layers such as a hafnium oxide layer and an aluminum oxide layer. The peripheral circuit gate insulation layer 114 may be formed to be thicker than the cell gate insulation layer 106. The peripheral circuit gate insulation layer 114 may be a multi-layered material.

Figure 5:
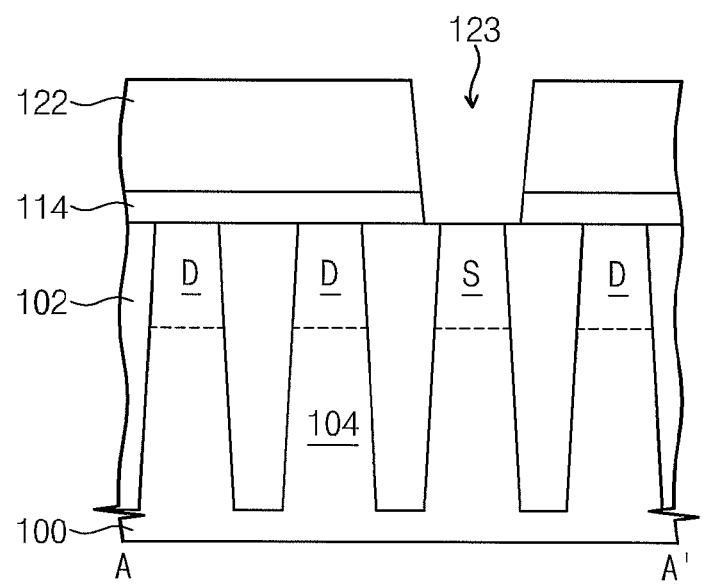

Referring to FIG. 5, a first insulation layer 122 may be formed on an entire surface of the substrate including the peripheral circuit gate insulation layer 114. In some embodiments, the first insulation layer 122 may be formed to include at least one of an oxide material, a nitride material and an oxynitride material.

The first insulation layer 122 and the peripheral circuit gate insulation layer 114 may be patterned to form a plurality of openings 123 exposing respective ones of the common source regions S. The openings 123 may be formed by forming a mask pattern (not shown) on the first insulation layer 122 and etching the first insulation layer 122 and the peripheral circuit gate insulation layer 114 using the mask pattern as an etch mask.

Figure 6:
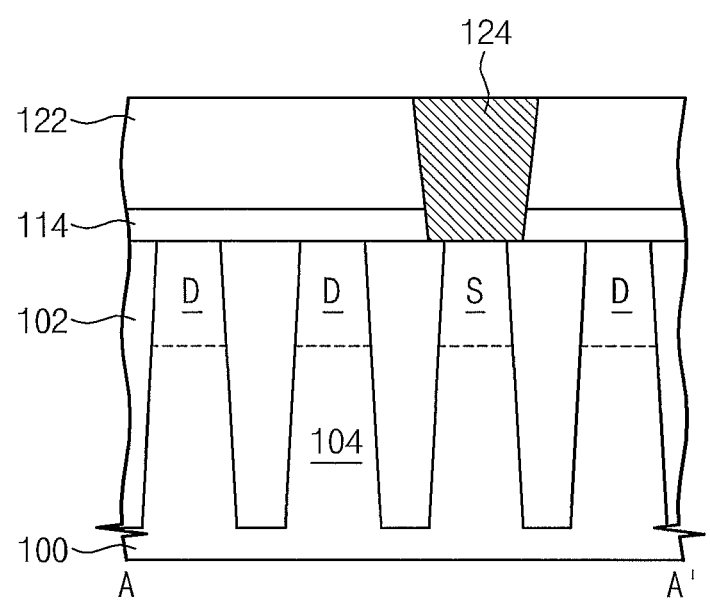

Referring to FIG. 6, first contact plugs 124 may be formed in respective ones of the openings 123. Each of the first contact plugs 124 may be formed to include a conductive material. For example, each of the first contact plugs 124 may be formed to include at least one of a semiconductor material (e.g., a polysilicon layer), a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable material. In an illustrative embodiment, each of the first contact plugs 124 may be formed to include a polysilicon layer.

The first contact plugs 124 may be formed by forming a conductive layer on the first insulation layer 122 to fill the openings 123 and etching the conductive layer until a top surface of the first insulation layer 122 is exposed. In some embodiments, the conductive layer may be formed using a physical vapor deposition (PVD) process or a chemical vapor deposition (CVD) process. In some embodiments, the etching process for forming the first contact plugs 124 may be performed using at least one of a dry etching process and a chemical mechanical polishing (CMP) process.

Referring again to FIGS. 1, 2A and 2B, a peripheral circuit gate electrode 116 may be formed on the peripheral circuit gate insulation layer 114 in the peripheral circuit region C. The peripheral circuit gate electrode 116 may be formed to include at least one of a semiconductor material (e.g., a polysilicon layer), a doped semiconductor material, a conductive metal nitride material (e.g., a titanium nitride (TiN) layer, a tantalum nitride (TaN) layer or a tungsten nitride (WN) layer) and a metal material (e.g., a ruthenium (Ru) layer, an iridium (Ir) layer, a titanium (Ti) layer, a tungsten (W) layer or a tantalum (Ta) layer), or other suitable material. In an illustrative embodiment, the peripheral circuit gate electrode 116 may be formed to include a polysilicon layer.

Although not shown in the drawings, the first contact plugs 124 and the peripheral circuit gate electrode 116 (see FIG. 2A) may be simultaneously formed, and formed of the same material. Specifically, the first insulation layer 122 and the peripheral circuit gate insulation layer 114 in the cell region A, B and F may be patterned to form the openings 123 exposing the common source regions S, and the first insulation layer 122 may be patterned to form a gate opening exposing the peripheral circuit gate insulation layer 114 in the peripheral circuit region C. Subsequently, the first contact plugs 124 and the peripheral circuit gate electrode 116 may be simultaneously formed using a damascene process in the openings 123 and the gate opening, respectively. In this case, the first contact plugs 124 may be formed to have top surfaces which are coplanar with a top surface of the first insulation layer 122.

Alternatively, before the first contact plugs 124 are formed, the peripheral circuit gate electrode 116 may first be formed in the peripheral circuit region C. Specifically, the first insulation layer 122 in the peripheral circuit region C may be selectively removed, and a conductive layer may be formed on an entire surface of the substrate where the first insulation layer 122 in the peripheral circuit region C is selectively removed. The conductive layer and the peripheral circuit gate insulation layer 114 may be then successively patterned to form the peripheral circuit gate electrode 116 in the peripheral circuit region C. After the peripheral circuit gate electrode 116 is formed, the first insulation layer 122 and the peripheral circuit gate insulation layer 114 in the cell region A, B and F may be patterned to form the openings 123 exposing the common source regions S, and the first contact plugs 124 may be formed in respective ones of the openings 123.

Figure 7:
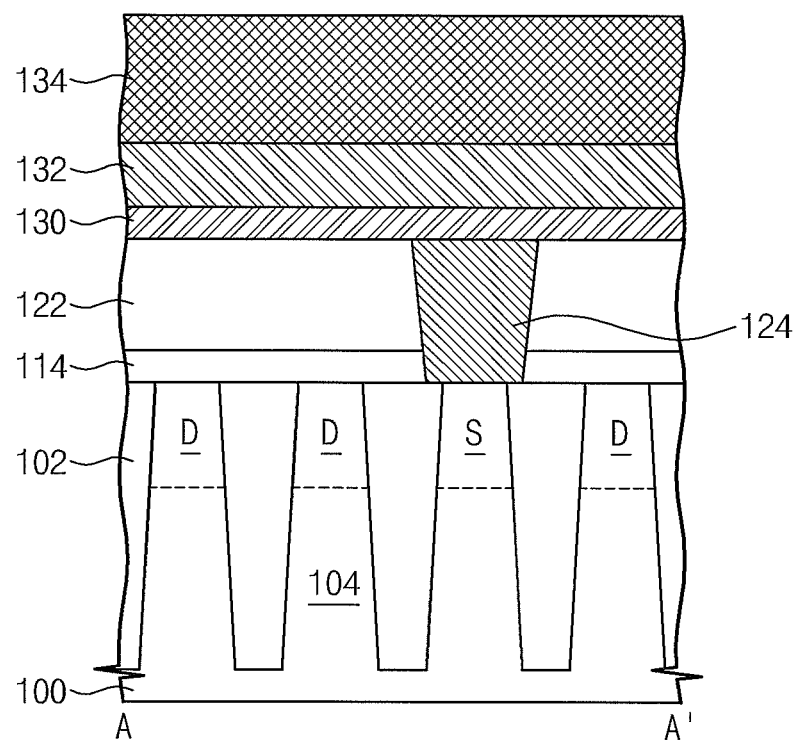
Figure 8:
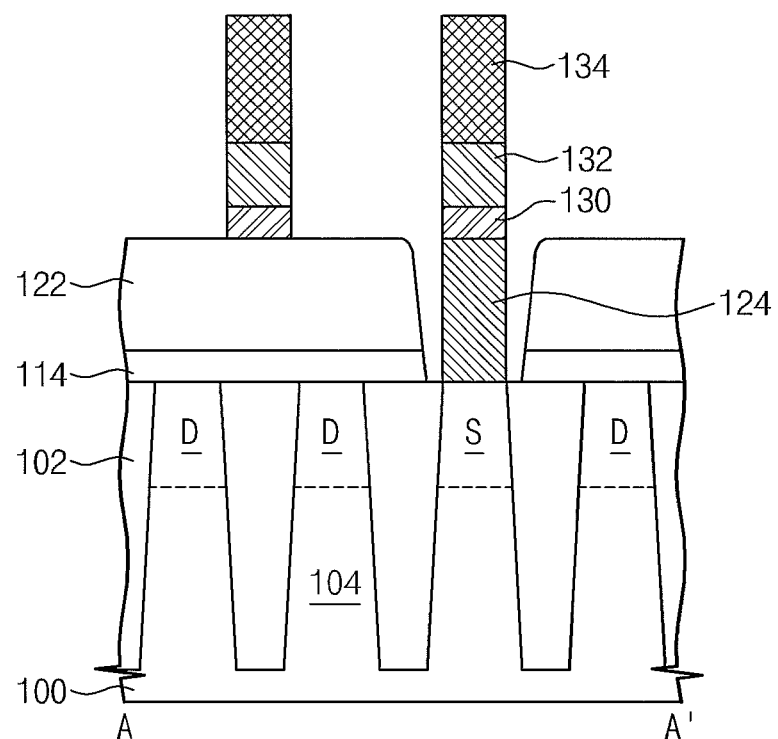

Referring to FIGS. 7 and 8, bit line structures may be formed on the substrate including the first contact plugs 124. The bit line structures may be electrically connected to the first contact plugs 124. Each of the bit line structures may be formed to include a barrier pattern 130, a conductive pattern 132 and a capping pattern 134. The bit line structures may be formed to extend in a second direction intersecting the first direction and in parallel with the trenches 105. The barrier pattern 130 may include a conductive metal nitride material, for example, a titanium nitride (TiN) layer, a tantalum nitride (TaN) layer or a tungsten nitride (WN) layer. The conductive pattern 132 may include a metal layer, for example, a ruthenium (Ru) layer, an iridium (Ir) layer, a titanium (Ti) layer, a tungsten (W) layer or a tantalum (Ta) layer, or other suitable barrier material. The capping pattern 134 may include at least one of an oxide layer, a nitride layer and an oxynitride layer, or other suitable material.

Formation of the bit line structures may include sequentially forming a barrier layer 130, a conductive layer 132 and a capping layer 134 on the first insulation layer 122, and patterning the capping layer 134, the conductive layer 132 and the barrier layer 130.

Referring again to FIGS. 1, 2A and 2B, the bit line structures may be formed to extend into the peripheral region C. The bit line structures may be electrically connected to the peripheral circuit gate electrode 116 in the peripheral circuit region C. In some embodiments, the bit line structures in the cell region A, B and F and the bit line structures in the peripheral circuit region C may be simultaneously formed.

Peripheral circuit impurity regions 136 may be formed in the active region located at both sides of the peripheral circuit gate electrode 116. The peripheral circuit impurity regions 136 may correspond to source/drain regions. The peripheral circuit impurity regions 136 may be formed to have a predetermined depth relative to the top surfaces of the active regions 104. In some embodiments, the peripheral circuit impurity regions 136 may be formed by forming a photoresist pattern (not shown) exposing the peripheral circuit region C on the substrate where the bit line structures are formed and by injecting impurities into the active regions 104 in the peripheral circuit region C using an ion implantation process that employs the bit line structure in the peripheral circuit region C as an ion implantation mask. In some embodiments, the impurities injected into the active regions 104 may include phosphorus atoms or boron atoms. According to an exemplary embodiment, bottom surfaces of the peripheral circuit impurity regions 136 may be located at a vertical position, or level, that is higher than bottom surfaces of the isolation layer 102.

Figure 9:
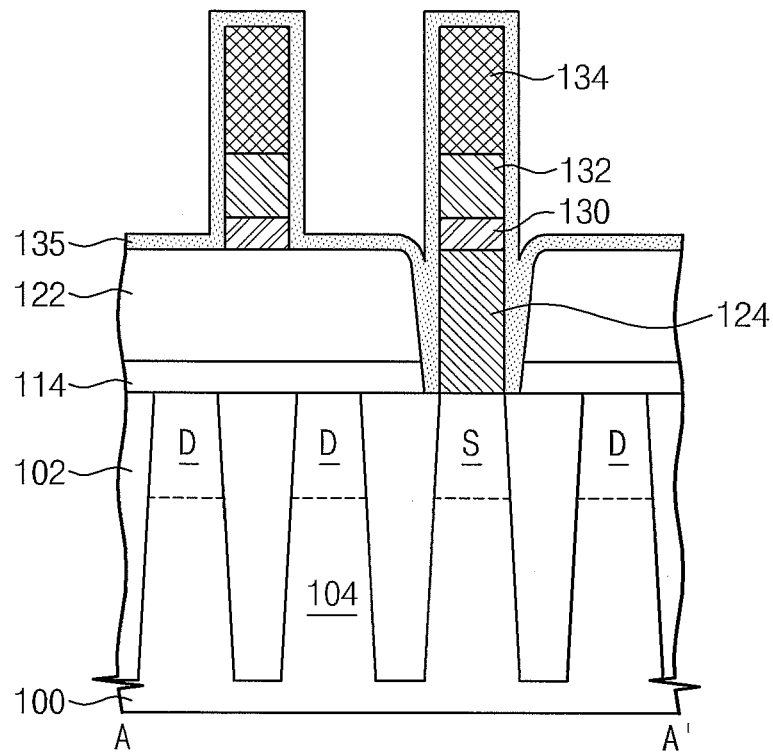

Referring to FIG. 9, an interfacial layer 135 may be formed on an entire surface of the substrate where the bit line structures are formed. The interfacial layer 135 may extend to cover sidewalls of the first contact plugs 124. In some embodiments, the interfacial layer 135 may be formed to include at least one of an oxide layer, a nitride layer and an oxynitride layer. In some embodiments, the interfacial layer 135 may be an oxide layer that is formed by an atomic layer deposition (ALD) process performed using a trisilylamine $((SiH_3)_3N)$ material and an oxygen gas as source materials. In some embodiments, the interfacial layer 135 may be formed to have a thickness of about 10 angstroms (Å) to about 200 angstroms (Å). In some embodiments, the interfacial layer 135 may be formed at a temperature of about 0° C. to 100° C. and under pressure of about 0.5 torr to about 5 torr. Further, in some embodiments, the interfacial layer 135 may be formed using an ammonia ($NH_3$) gas as a process gas. While the interfacial layer 135 is formed, the trisilylamine $((SiH_3)_3N)$ material, the oxygen gas and the ammonia gas may be injected into a process chamber at a flow rate of about 50 standard cubic centimeters per minute (sccm) to about 500 sccm, at a flow rate of about 10 sccm to 500 sccm, and at a flow rate of about 10 sccm to about 100 sccm, respectively.

Referring again to FIGS. 1, 2A and 2B, the interfacial layer 135 may be formed to additionally cover sidewalls of the peripheral circuit gate electrode 116 in the peripheral circuit region C.

Figure 10:
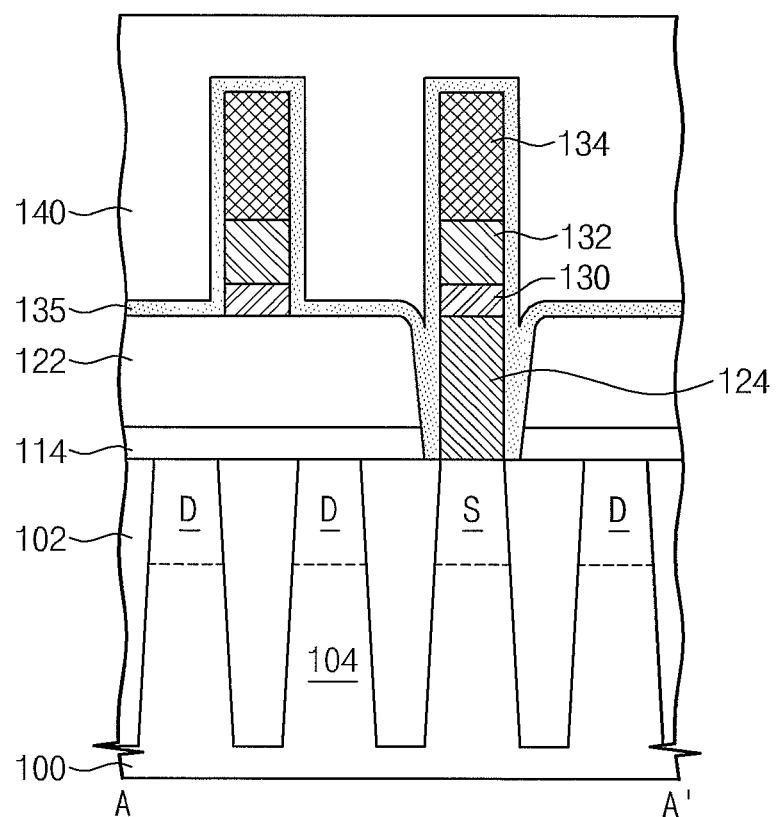

Referring to FIG. 10, a flowable insulation layer 140 may be formed on the interfacial layer 135. Thus, the flowable insulation layer 140 may be formed to cover the bit line structures. The flowable insulation layer 140 may be formed using a chemical vapor deposition (CVD) process. In some embodiments, the flowable insulation layer 140 may be formed to include a silazane $(H_3Si(NHSiH_2)_nNHSiH_3)$ material.

Figure 11:
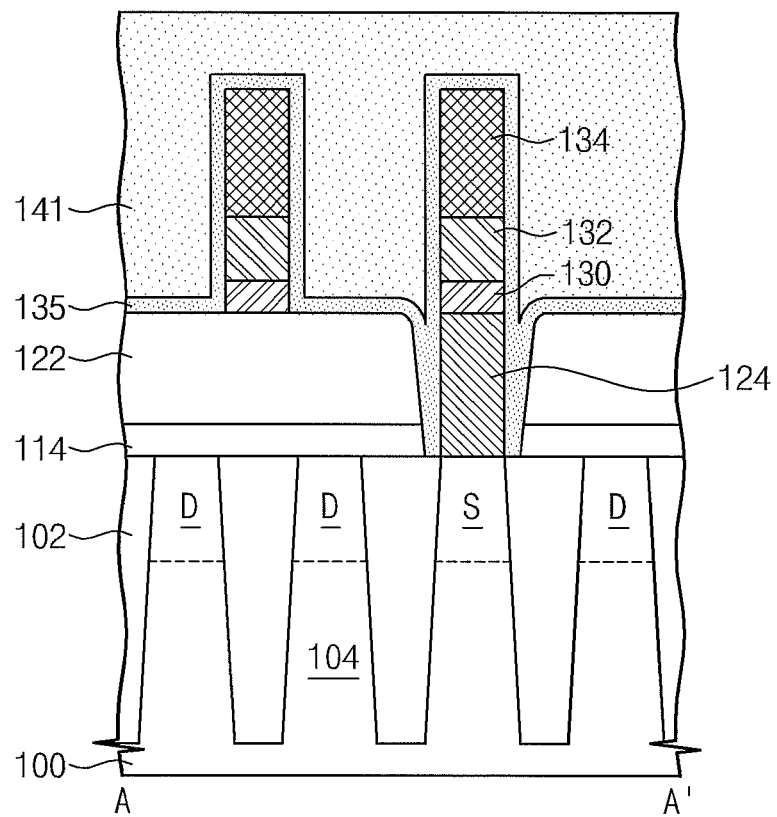
Figure 12:
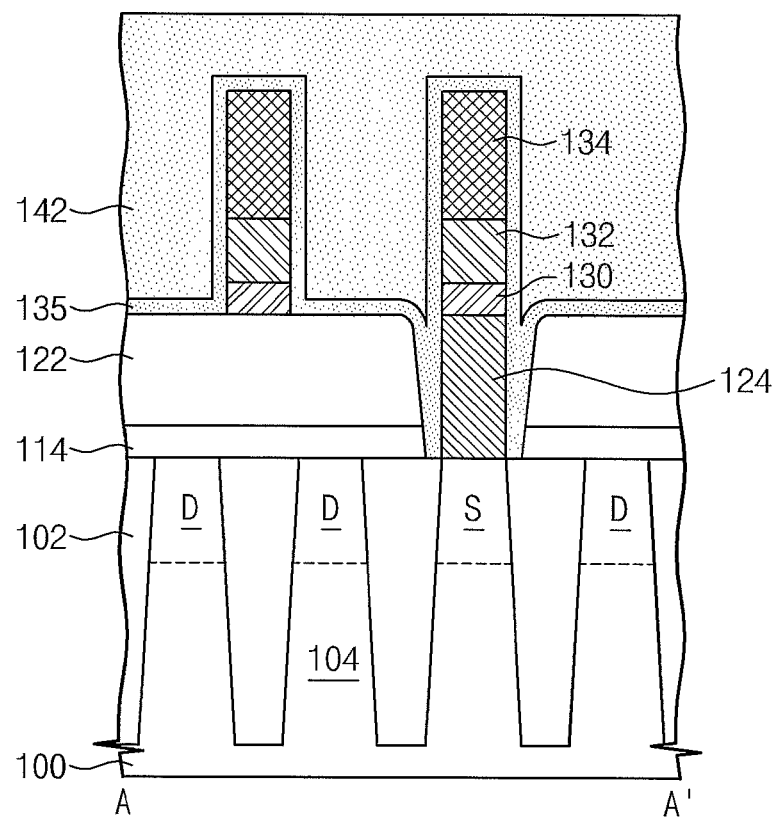

Referring to FIGS. 11 and 12, the flowable insulation layer 140 may be treated. Treatment can include, for example, curing to form a cured insulation layer 141 and the cured insulation layer 141 may then be annealed to form a second insulation layer 142. Curing the flowable insulation layer 140 may be performed using at least one of an ozone gas, water vapor, and an ammonia gas as an ambient gas at a temperature of about 150° C. The curing process may transform Si—N structures in the flowable insulation layer 140 containing the silazane material into Si—O structures having a soft or porous state. Annealing the cured insulation layer 141 may be performed using at least one of water vapor, an ozone gas and an ammonia gas as an ambient gas at a temperature of about 200° C. to about 1050° C. The annealing process may transform the porous or soft Si—O structures in the cured insulation layer 141 into more dense Si—O structures.

As described above, the interfacial layer 135 may be disposed between the flowable insulation layer 140 and the bit line structures. Thus, the interfacial layer 135 may reduce the tensile stress generated at an interface between the flowable insulation layer 140 and the bit line structures during the curing process and the annealing process for transforming the flowable insulation layer 140 into the second insulation layer 142. Accordingly, the interfacial layer 135 is operable to prevent an electrical bridging phenomenon that may otherwise occur between second contact plugs 150 which are later formed along a direction parallel with the bit line structures in a subsequent fabrication process. As a result, a highly reliable semiconductor device may be realized without degradation of productivity.

Further, the second insulation layer 142 may be formed of a flowable insulation material, as described above. Thus, the second insulation layer 142 may be formed to fill spaces between the bit line structures having a small and fine pitch size without any voids. Accordingly, a highly integrated semiconductor device may be realized.

Figure 13:
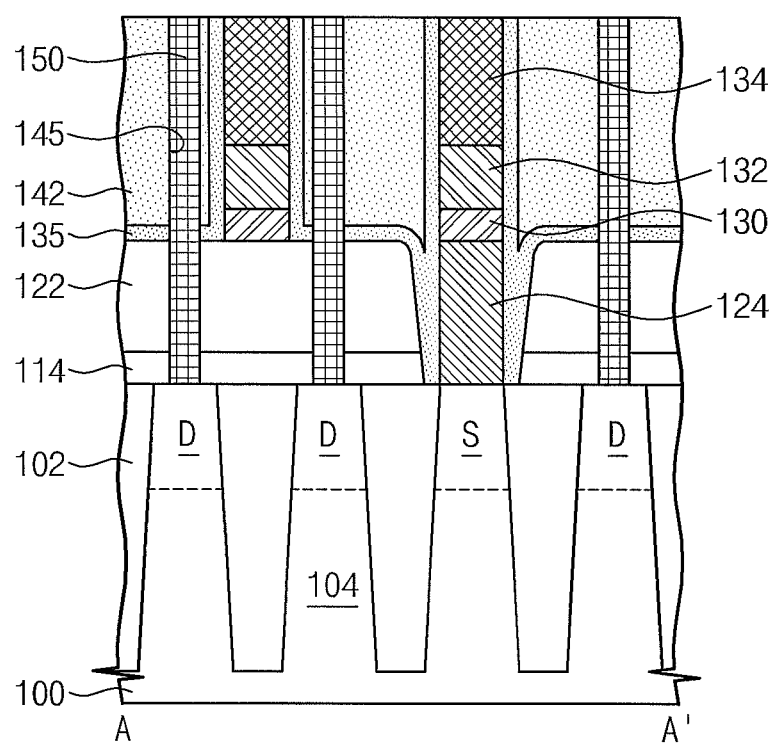

Referring to FIG. 13, the second insulation layer 142 may be planarized to expose top surfaces of the bit line structures. In some embodiments, planarization of the second insulation layer 142 may be performed using a chemical mechanical polishing (CMP) process.

Referring again to FIGS. 1, 2A and 2B, after the second insulation layer 142 is planarized, the second insulation layer 142, the first insulation layer 122 and the peripheral circuit gate insulation layer 114 may be patterned to form contact holes 145 exposing respective ones of the drain regions (D of FIGS. 2A and 2B). The contact holes 145 may be formed by forming a mask pattern (not shown) on the second insulation layer 145 and by etching the second insulation layer 142, the first insulation layer 122 and the peripheral circuit gate insulation layer 114 using the mask pattern as an etch mask.

Second contact plugs 150 may be formed in respective ones of the contact holes 145. The second contact plugs 150 may be formed to include a conductive material. For example, each of the second contact plugs 150 may be formed to include at least one of a semiconductor material (e.g., a polysilicon layer), a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable conductive material.

Forming the second contact plugs 150 may include forming a conductive layer on the second insulation layer 142 to fill the contact holes 145 and etching the conductive layer to expose a top surface of the second insulation layer 142. The conductive layer may be formed using a physical vapor deposition (PVD) process or a chemical vapor deposition (CVD) process. Etching the conductive layer may be performed using at least one of a dry etching process and a chemical mechanical polishing (CMP) process.

Data storage elements 210 may be formed on the second contact plugs 150. The data storage elements 210 may be electrically connected to respective ones of the second contact plugs 150. The data storage elements 210 may be embodied in various forms, as illustrated in FIGS. 3A and 3B.

Figure 14:
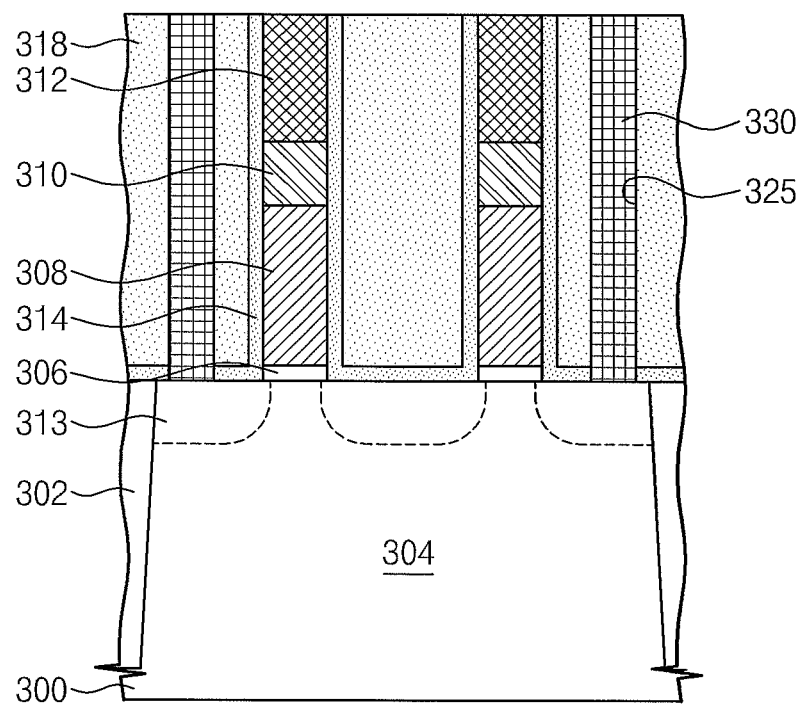
FIG. 14 is a cross sectional view illustrating a semiconductor device according to another embodiment.

FIG. 14 is a cross sectional view illustrating a semiconductor device according to another embodiment.

Referring to FIG. 14, an isolation layer 302 may be disposed in a substrate 300 to define an active region 304. The isolation layer 302 may correspond to a shallow trench isolation layer. However, the isolation layer 302 is not limited to the shallow trench isolation layer. The isolation layer 302 may include an insulation material. For example, the isolation layer 302 may include at least one of a silicon oxide layer, a silicon nitride layer and a silicon oxynitride layer. The substrate 300 may include a semiconductor material. For example, the substrate 300 may include at least one of a silicon material and a germanium material.

A plurality of gate patterns, for example, a pair of gate patterns may be disposed to cross over the active region 304. Each of the gate patterns may include one or more of a gate insulation layer 306, a gate electrode 308, a silicide pattern 310 and a capping pattern 312 which are sequentially stacked. Impurity regions 313 may be provided in the active region 304. The impurity regions 313 may correspond to source/drain regions. Each of the gate patterns may be disposed on the active region 304 between two separate impurity regions 313 adjacent to each other.

The impurity regions 313 may be disposed to have a predetermined depth relative to a top surface of the active region 304. In some embodiments, the impurity regions 313 may be formed by injecting impurities into the active region 304. In some embodiments, the impurities may include phosphorus atoms or boron atoms. According to an embodiment, bottom portions of the impurity regions 313 may be located at a higher level, or vertical position, relative to a bottom surface of the isolation layer 302.

The gate insulation layer 306 may include at least one of an oxide material, a nitride material, an oxynitride material and a high-k dielectric material. The high-k dielectric material may correspond to an insulation material having a dielectric constant which is higher than that of the nitride material. For example, the high-k dielectric material may include at least one of insulating metal oxide layers such as a hafnium oxide layer and an aluminum oxide layer. Preferably, the gate insulation layer 306 may be a thermal oxide layer.

The gate electrode 308 may include a conductive material. For example, the gate electrode 308 may include at least one of a doped semiconductor material, a conductive metal nitride material (e.g., a titanium nitride (TiN) layer, a tantalum nitride (TaN) layer or a tungsten nitride (WN) layer) and a metal material (e.g., a ruthenium (Ru) layer, an iridium (Ir) layer, a titanium (Ti) layer, a tungsten (W) layer or a tantalum (Ta) layer), or other suitable material. In some embodiments, the silicide pattern 310 may include a metal silicide layer. The capping pattern 312 may include at least one of an oxide layer, a nitride layer and an oxynitride layer, or other suitable capping material.

An interfacial layer 314 may be disposed to cover at least sidewalls of the gate patterns. The interfacial layer 314 may include at least one of an oxide layer, a nitride layer and an oxynitride layer. Preferably, the interfacial layer 314 may be an oxide layer that is formed by an atomic layer deposition (ALD) process performed using a trisilylamine (($SiH_3$)$_3$N) material and an oxygen gas as source materials.

An interlayer insulation layer 318 may be disposed on the substrate including the interfacial layer 314. The interlayer insulation layer 318 may be disposed to expose top surfaces of the gate patterns. The interlayer insulation layer 318 may be a single layered material or a multi-layered material. The interlayer insulation layer 318 may include at least one of an oxide layer, a nitride layer and an oxynitride layer. Preferably, the interlayer insulation layer 318 may be an oxide layer that is formed by curing and annealing a flowable insulation material.

As described above, the interfacial layer 314 may be disposed between the interlayer insulation layer 318 and the gate patterns. Thus, the interfacial layer 314 may reduce the tensile stress generated at an interface between the interlayer insulation layer 318 and the gate patterns during the curing process and the annealing process for forming the interlayer insulation layer 318. Accordingly, the interfacial layer 314 may prevent an electrical bridging phenomenon that would otherwise occur between contact plugs 330 which are formed along a direction parallel with the gate patterns in a subsequent fabrication process. As a result, a highly reliable semiconductor device may be realized without degradation of productivity.

Further, the interlayer insulation layer 318 may be formed of a flowable insulation material, as described above. Thus, the interlayer insulation layer 318 may be formed to fill spaces between the gate patterns having a small and fine pitch size while mitigating or eliminating the presence of voids. Accordingly, a highly integrated semiconductor device may be realized.

Contact holes 325 may penetrate the interlayer insulation layer 318 and the interfacial layer 314, and contact plugs 330 may be disposed in respect ones of the contact holes 315. The contact plugs 330 may be disposed to contact the impurity regions 313. Each of the contact plugs 330 may include a conductive material. For example, each of the contact plugs 330 may include at least one of a semiconductor material (e.g., a polysilicon layer), a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable material.

Although not shown in FIG. 14, data storage elements (refer to the elements indicated by the reference number 210 in FIG. 2B) may be disposed on the contact plugs 330. The data storage elements may be electrically connected to respective ones of the contact plugs 330. The data storage elements may be embodied in various forms, for example, according to the forms described herein.

FIGS. 15 to 20 are cross-sectional views illustrating a method of fabricating a semiconductor device according to another embodiment.

Figure 15:
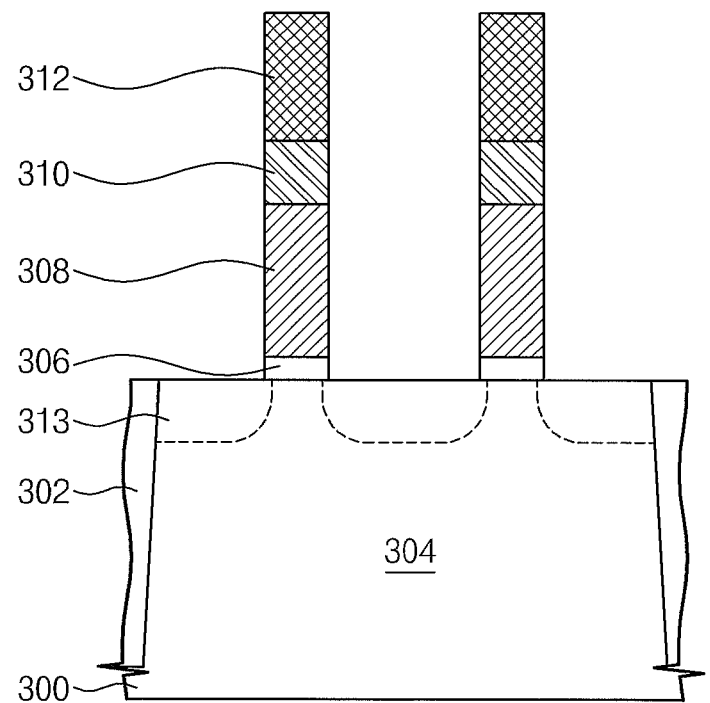
FIGS. 15 to 20 are cross sectional views illustrating a method of fabricating a semiconductor device according to another embodiment.

Referring to FIG. 15, a substrate 300 having an isolation layer 302 may be provided. The isolation layer 302 may define an active region 304. The substrate 300 may include a semiconductor material. For example, the substrate 300 may include at least one of a silicon material and a germanium material, or other suitable semiconductor material.

The isolation layer 302 may be formed by forming a groove, channel, or recess in the substrate 300, forming an insulation layer on the substrate to fill the groove, and etching the insulation layer to expose a top surface of the substrate 300. The isolation layer 302 may include an insulation layer. For example, the isolation layer 302 may be formed to include at least one of an oxide material, a nitride material and an oxynitride material.

A plurality of gate patterns, for example, a pair of gate patterns may be formed to cross over the active region 304. Each of the gate patterns may be formed to include a gate insulation layer 306, a gate electrode 308, a silicide pattern 310 and a capping pattern 312 which are sequentially stacked.

In some embodiments, the gate insulation layer 306 may be formed to include at least ones of an oxide material, a nitride material, an oxynitride material and a high-k dielectric material. The high-k dielectric material may correspond to an insulation material having a dielectric constant which is higher than that of the nitride material. For example, the high-k dielectric material may be formed to include at least one of insulating metal oxide layers such as a hafnium oxide layer and an aluminum oxide layer. In some embodiments, the gate insulation layer 306 may be formed of a thermal oxide layer.

The gate electrode 308 may be formed to include a conductive material. For example, the gate electrode 308 may be formed to include at least one of a doped semiconductor material, a conductive metal nitride material (e.g., a titanium nitride (TiN) layer, a tantalum nitride (TaN) layer or a tungsten nitride (WN) layer) and a metal material (e.g., a ruthenium (Ru) layer, an iridium (Ir) layer, a titanium (Ti) layer, a tungsten (W) layer or a tantalum (Ta) layer). The silicide pattern 310 may be formed to include a metal silicide layer or other suitable material. The capping pattern 312 may be formed to include at least one of an oxide layer, a nitride layer and an oxynitride layer, or other suitable material layer.

Impurity regions 313 may be formed in the active region 304. The impurity regions 313 may correspond to source/drain regions. The impurity regions 313 may be formed to have a predetermined depth relative to a top surface of the active region 304. The impurity regions 313 may be formed by implanting impurities into the active region 304 using the gate patterns as ion implantation masks. In some embodiments, the impurities may include phosphorus atoms or boron atoms. According to an embodiment, bottom portions of the impurity regions 313 may be located at a higher level, or vertical position, than a bottom surface of the isolation layer 302.

Figure 16:
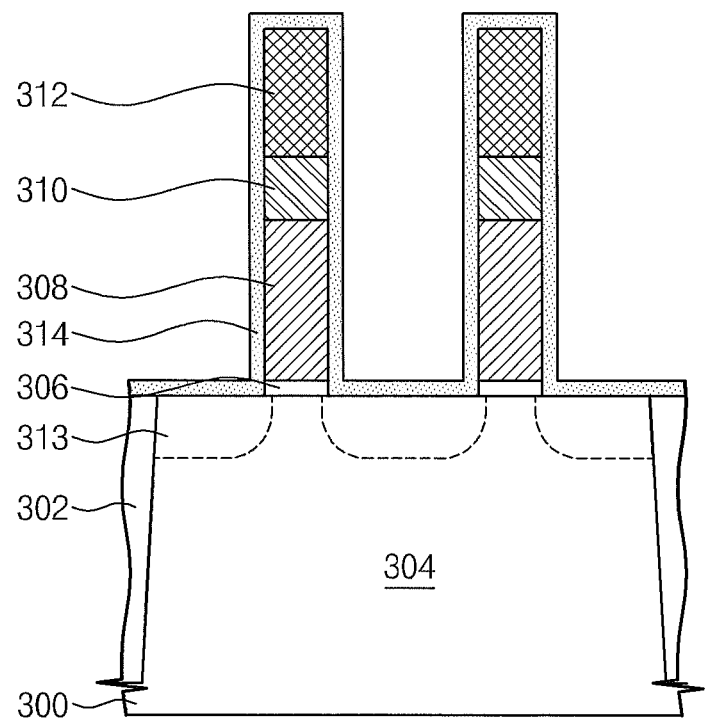

Referring to FIG. 16, an interfacial layer 314 may be formed to cover at least sidewalls of the gate patterns. In some embodiments, the interfacial layer 314 may be formed to include at least one of an oxide layer, a nitride layer and an oxynitride layer. Preferably, the interfacial layer 314 may be an oxide layer that is formed by an atomic layer deposition (ALD) process performed using a trisilylamine ($(SiH_3)_3N$) material and an oxygen gas as source materials. In some embodiments, the interfacial layer 314 may be formed to have a thickness of about 10 angstroms (Å) to about 200 angstroms (Å). In some embodiments, the interfacial layer 314 may be formed at a temperature of about 0° C. to 100° C. and under pressure of about 0.5 torr to about 5 torr. Further, in some embodiments, the interfacial layer 314 may be formed using an ammonia ($NH_3$) gas as a process gas. In some embodiments, while the interfacial layer 314 is formed, the trisilylamine ($(SiH_3)_3N$) material, the oxygen gas and the ammonia gas may be injected into a process chamber at a flow rate of about 50 standard cubic centimeters per minute (sccm) to about 500 sccm, at a flow rate of about 10 sccm to 500 sccm, and at a flow rate of about 10 sccm to about 100 sccm, respectively.

Figure 17:
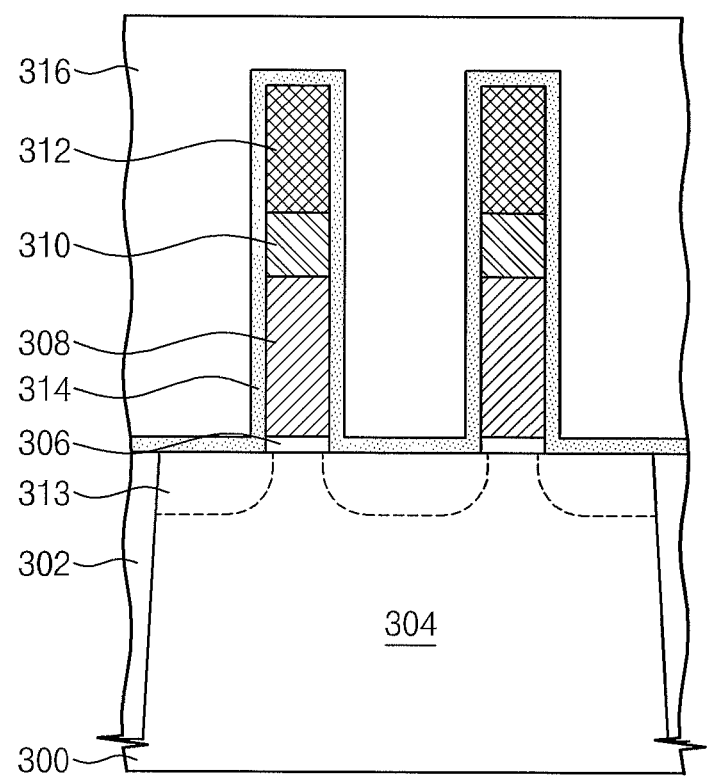

Referring to FIG. 17, a flowable insulation layer 316 may be formed on the interfacial layer 314. The flowable insulation layer 316 may be formed using a chemical vapor deposition (CVD) process. Preferably, the flowable insulation layer 140 may be formed to include a silazane ($H_3Si(NH-SiH_2)_nNHSiH_3$) material.

Figure 18:
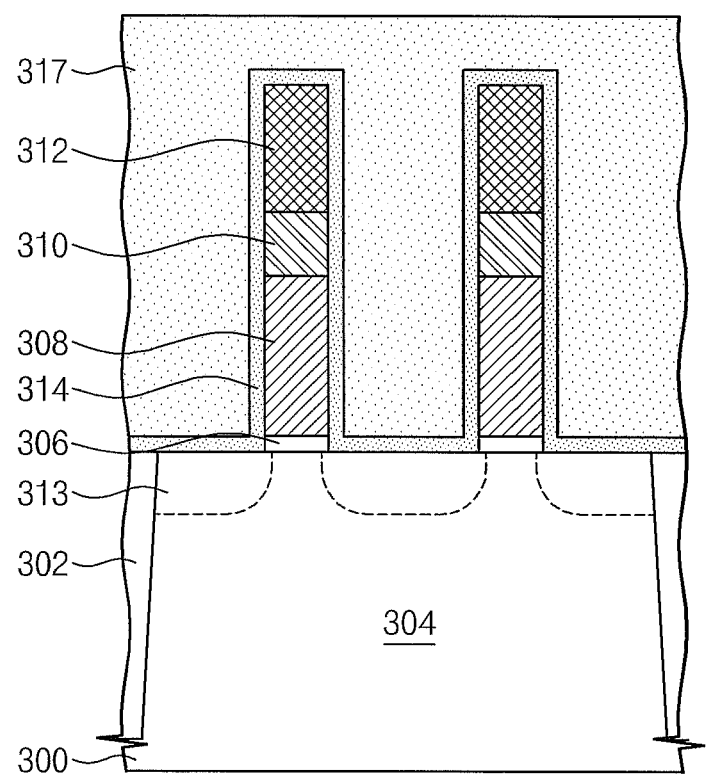
Figure 19:
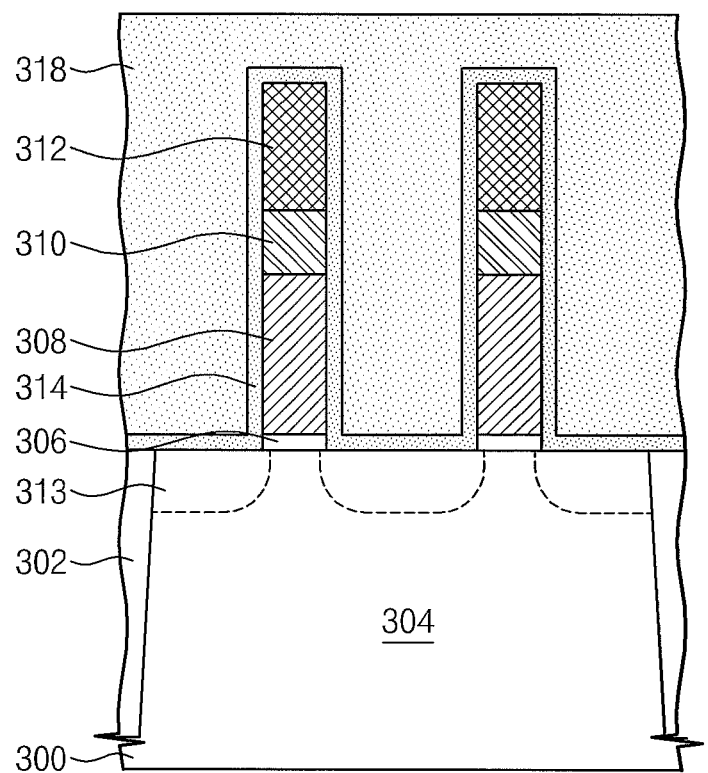

Referring to FIGS. 18 and 19, the flowable insulation layer 316 may be cured to form a cured insulation layer 317, and the cured insulation layer 317 may be annealed to form an interlayer insulation layer 318. Curing the flowable insulation layer 316 may be performed using at least one of an ozone gas, water vapor and an ammonia gas as an ambient gas at a temperature of about 150° C. The curing process may transform Si—N structures in the flowable insulation layer 316 containing the silazane material into Si—O structures having a soft or porous state. Annealing the cured insulation layer 317 may be performed using at least one of water vapor, an ozone gas and an ammonia gas as an ambient gas at a temperature of about 200° C. to about 1050° C. The annealing process may transform the porous or soft Si—O structures in the cured insulation layer 317 into more dense Si—O structures.

As described herein, the interfacial layer 314 may be disposed between the interlayer insulation layer 318 and the gate patterns. Thus, the interfacial layer 314 may reduce the tensile stress that otherwise would be generated at an interface between the interlayer insulation layer 318 and the gate patterns during the curing process and the annealing process for forming the interlayer insulation layer 318. Accordingly, the interfacial layer 314 may prevent an electrical bridging phenomenon between contact plugs which are formed in a direction parallel with the gate patterns in a subsequent process. As a result, a highly reliable semiconductor device may be realized without degradation of productivity.

In some embodiments, the interlayer insulation layer 318 may be formed of a flowable insulation material, as described above. Thus, the interlayer insulation layer 318 may be formed to fill spaces between the gate patterns having a small and fine pitch size while mitigating or eliminating the formation of voids. Accordingly, a reliable, highly integrated semiconductor device may be realized.

Figure 20:
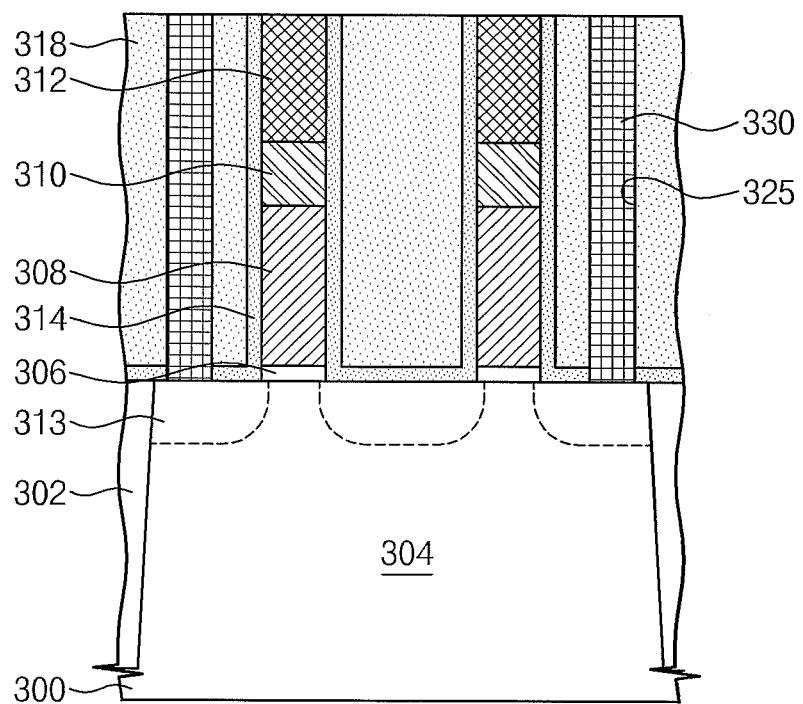

Referring to FIG. 20, the interlayer insulation layer 318 may be planarized to expose top surfaces of the gate patterns. The planarization of the interlayer insulation layer 318 may be performed using a chemical mechanical polishing (CMP) process.

After the interlayer insulation layer 318 is planarized, the interlayer insulation layer 318 and the interfacial layer 314 may be patterned to form contact holes 325 exposing the impurity regions 313. The contact holes 325 may be formed by forming a mask pattern (not shown) on the interlayer insulation layer 318 and by etching the interlayer insulation layer 318 and the interfacial layer 314 using the mask pattern as an etch mask.

Contact plugs 330 may be formed in respective ones of the contact holes 325. The contact plugs 330 may be formed to include a conductive material. For example, each of the contact plugs 330 may be formed to include at least one of a semiconductor material (e.g., a polysilicon layer), a metal-semiconductor compound material (e.g., a tungsten silicide layer), a conductive metal nitride material (e.g., a titanium nitride (TiN) layer, a tantalum nitride (TaN) layer or a tungsten nitride (WN) layer) and a metal material (e.g., a titanium (Ti) layer, a tungsten (W) layer or a tantalum (Ta) layer), or other suitable material.

Forming the contact plugs 330 may include forming a conductive layer on the interlayer insulation layer 318 to fill the contact holes 325 and etching the conductive layer to expose a top surface of the interlayer insulation layer 318. In some embodiments, the conductive layer may be formed using a physical vapor deposition (PVD) process or a chemical vapor deposition (CVD) process. Etching the conductive layer may be performed using at least one of a dry etching process and a chemical mechanical polishing (CMP) process.

Although not shown in FIG. 20, data storage elements (refer to the elements indicated by the reference number 210 in FIG. 2B) may be formed on the contact plugs 330. The data storage elements may be electrically connected to respective ones of the contact plugs 330. The data storage elements may be embodied in various forms, as illustrated in FIGS. 3A and 3B.

Figure 21:
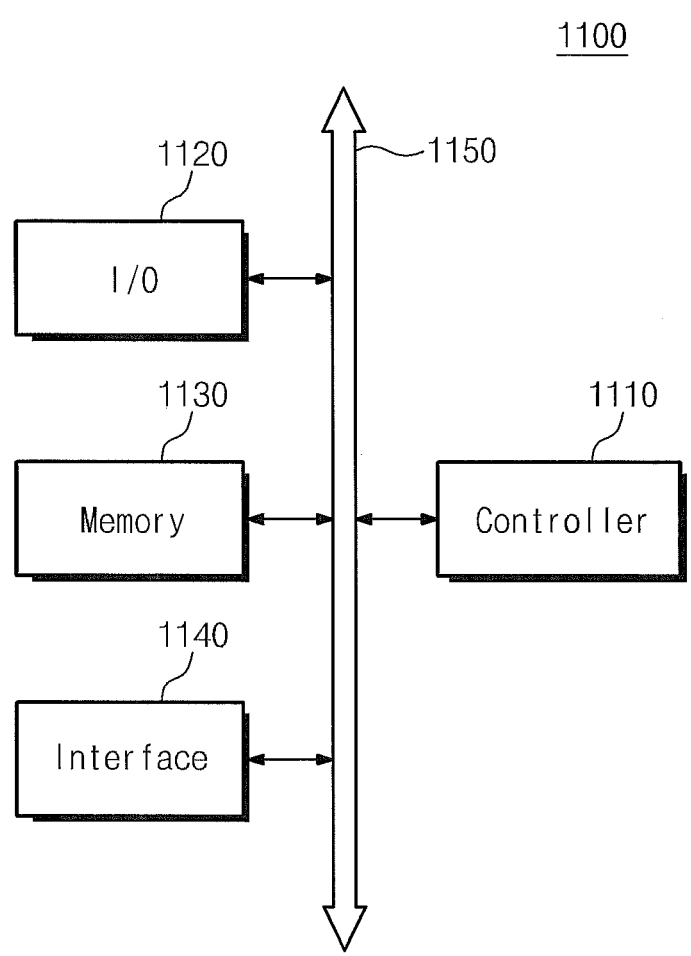
FIG. 21 is a schematic block diagram illustrating an example of electronic systems including at least one of semiconductor devices according to some embodiments.

FIG. 21 is a schematic block diagram illustrating an example of electronic systems including at least one of semiconductor devices according to some embodiments.

Referring to FIG. 21, an electronic system 1100 according to an embodiment may be applied to personal digital assistants (PDAs), portable computers, web tablets, wireless phones, mobile phones, digital music players, memory cards or other electronic products. The electronic products may receive or transmit information data by wireless communication protocol.

The electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one microprocessor, a digital processor, a microcontroller or the like. The memory device 1130 may store data and/or commands executed by the controller 1110. The I/O unit 1120 may receive data or signals from an external system or may transmit data or signals to the external system. The I/O unit 1120 may include at least one of a key pad, a key board and a display unit.

The memory device 1130, or other devices of the electronic system 1100, may include at least one of the semiconductor devices according to the embodiments described herein. The memory device 1130 may further include another type of semiconductor memory devices which are different from the semiconductor memory devices described herein.

The interface unit 1140 may receive data or signals from an external communication network or may transmit data or signals to the external communication network.

Figure 22:
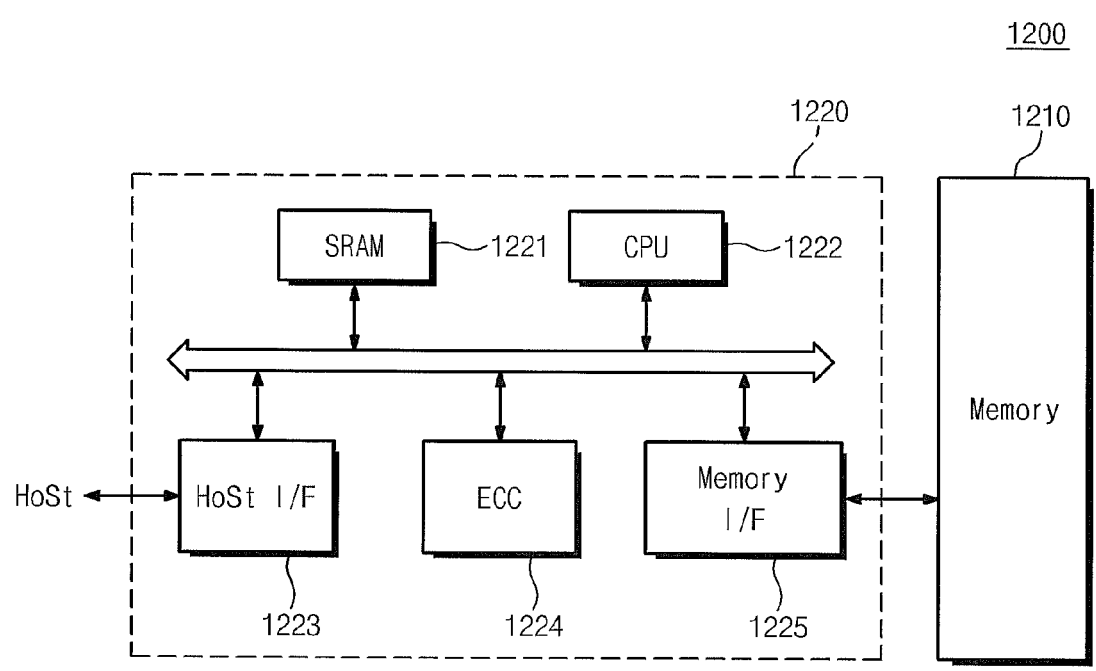
FIG. 22 is a schematic block diagram illustrating an example of memory cards including at least one of semiconductor devices according to some embodiments.

FIG. 22 is a schematic block diagram illustrating an example of memory cards including at least one of semiconductor devices according to some embodiments.

Referring to FIG. 22, a memory card 1200 according to an embodiment may include a memory device 1210. The memory card 1200 may be provided to store a large capacity of data, and the memory device 1210 may include at least one of the semiconductor devices according to the embodiments described above. The memory card 1200 may further include a memory controller 1220 that controls data communication between a host and the memory device 1210.

The memory controller 1220 may include a central processing unit (CPU) 1222 that controls overall operations of the memory card 1200. Moreover, the memory controller 1220 may further include a static random access memory (SRAM) device 1221 that is used as an operation memory of the CPU 1222. In addition, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. Furthermore, the memory controller 1220 may include an error check and correction (ECC) block 1224. The ECC block 1224 may detect and correct errors of data which are read out from the memory device 1210. Even though not shown in the drawing, the memory card 1200 may further include a read only memory (ROM) device that stores code data to interface with the host.

The memory card 1200 may be used as a portable data storage media. Alternatively, the memory card 1200 may be realized using a solid state disk (SSD) that can replaces hard disks of computer systems. The memory card 1200, and any devices thereon, may include at least one of the semiconductor devices according to the embodiments described above.

Figure 23:
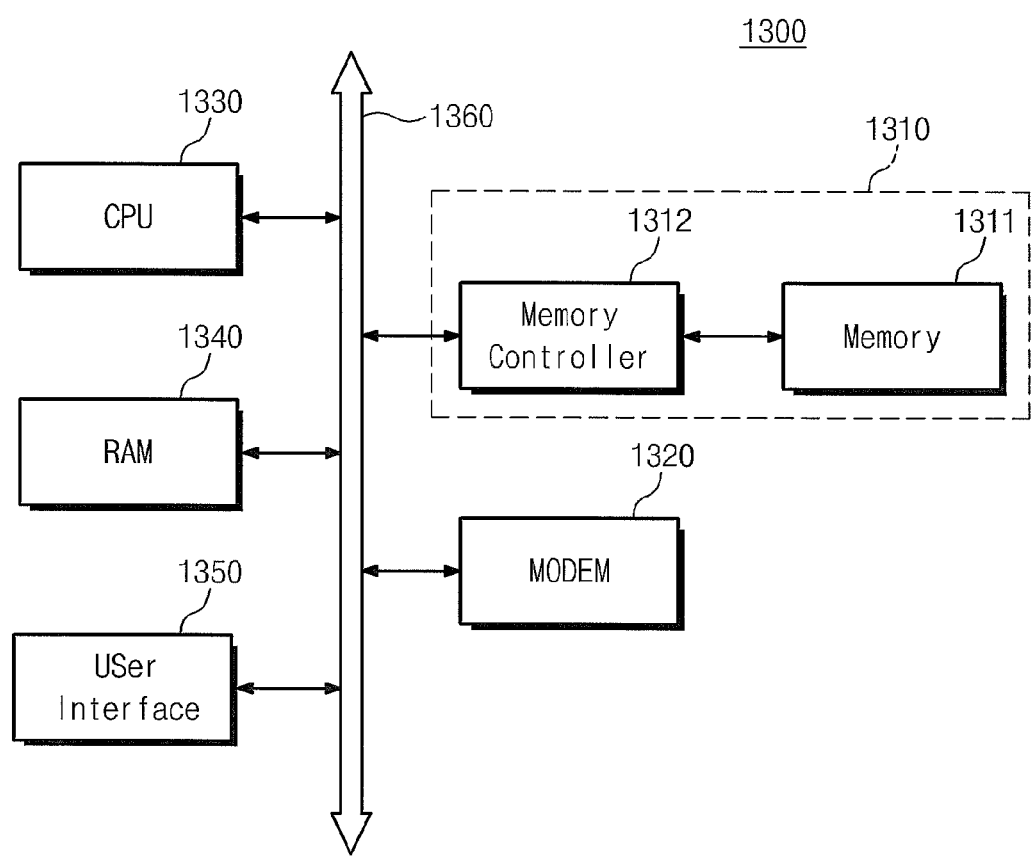
FIG. 23 is a schematic block diagram illustrating an example of information processing systems in which semiconductor devices according to some exemplary embodiments are mounted.

FIG. 23 is a schematic block diagram illustrating an example of information processing systems in which semiconductor devices according to some exemplary embodiments are mounted.

Referring to FIG. 23, at least one of the semiconductor devices according to some exemplary embodiments may be mounted in a memory unit 1310, and the memory unit 1310 may be employed in an information processing system 1300, for example, a mobile system, a desk top computer or the like. The information processing system 1300 may further include a modulator-demodulator (MODEM) 1320, a central processing unit (CPU) 1330, a random access memory (RAM) device 1340 and a user interface unit 1350 that communicate with the memory unit 1310 through a data bus 1360. At least two of the memory unit 1310, the MODEM 1320, the CPU 1330, the RAM device 1340 and the user interface unit 1350 may also communicate with each other through the data bus 1360. The memory unit 1310 may have substantially the same configuration as the memory card 1200 illustrated in FIG. 22. That is, the memory unit 1310 may include a memory device 1311 including at least one of the semiconductor devices according to some exemplary embodiments and a memory controller 1312 that controls overall operations of the memory device 1311.

The memory unit 1310 may store data processed by the CPU 1330 or data received from an external system. The memory unit 1310 may be configured to include a solid state disk. In this case, the memory unit 1310 constituting the information processing system 1300 may stably and reliably store a large capacity of data. If the reliability of the memory unit 1310 is improved, the information processing system 1300 may save sources that are required to check and correct data. As a result, the information processing system 1300 may provide fast data communication. Even though not shown in the drawings, the information processing system 1300 may further include a camera image processor, an application chipset and/or an input/output unit. The information processing system 1300, and any devices therein, may include at least one of the semiconductor devices according to the embodiments described above.

The semiconductor devices according to the exemplary embodiments described above may be encapsulated using various packaging techniques. For example, the semiconductor devices according to the aforementioned exemplary embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the embodiments set forth above, an interfacial layer may be disposed between conductive structures and an insulation layer formed of a flowable material. Thus, the interfacial layer can reduce the tensile stress that would otherwise be generated at an interface between the conductive structures and the insulation layer during a curing process and an annealing process for forming the insulation layer. Accordingly, the interfacial layer may mitigate or prevent an electrical bridging phenomenon which otherwise may occur between contact plugs which are formed along a direction parallel with the conductive structures in a subsequent fabrication process. As a result, a highly reliable semiconductor device may be realized without degradation of productivity.

Further, the insulation layer is formed of a flowable material. Thus, the insulation layer can be formed to fill spaces between the conductive structures having a small and fine pitch size while mitigating or eliminating the generation of voids. Accordingly, a highly integrated semiconductor device may be realized.

While the inventive concept has been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor device, the method comprising:
   forming isolation structures in a substrate to define active regions;
   forming conductive structures on the substrate to cross over at least two of the active regions and the isolation structures, the conductive structures extending in a first direction;
   prior to formation of the conductive structures, forming trenches in the substrate to extend in a second direction intersecting the active regions;
   prior to formation of the conductive structures, forming buried gate patterns in respective ones of the trenches;
   conformally forming an interfacial layer on the substrate in contact with the conductive structures; and
   forming a first insulation layer on the interfacial layer,
   wherein the first insulation layer is formed using a flowable chemical vapor deposition (CVD) process, and
   wherein the interfacial layer reduces a tensile stress generated at an interface between the conductive structures and the first insulation layer while the first insulation layer is formed.

2. The method of claim 1, wherein conformally forming the interfacial layer comprises forming using an atomic layer deposition (ALD) process.

3. The method of claim 2, wherein the atomic layer deposition (ALD) process is performed using a trisilylamine ($(SiH_3)_3N$) material and an oxygen gas as source materials.

4. The method of claim 1, wherein forming the first insulation layer using the flowable chemical vapor deposition (CVD) process includes:
   forming a flowable insulation layer on the interfacial layer;
   curing the flowable insulation layer to form a cured insulation layer; and
   annealing the cured insulation layer.

5. The method of claim 4, wherein the flowable insulation layer is formed to include a silazane ($H_3Si(NHSiH_2)_nNHSiH_3$) material.

6. The method of claim 1:
   wherein each of the conductive structures is formed to include a second insulation layer, a barrier pattern, an electrode pattern and a capping pattern sequentially stacked or to include a conductive pattern, a barrier pattern, an electrode pattern and a capping pattern sequentially stacked; and
   wherein the conductive pattern is electrically connected to the active region between the pair of adjacent buried gate patterns.

7. The method of claim 1, further comprising forming impurity regions in the active region positioned at both sides of each of the conductive structures.

8. A method of fabricating a semiconductor device, the method comprising:
   forming isolation structures in a substrate to define active regions;
   forming conductive structures on the substrate to cross over at least two of the active regions and the isolation structures, the conductive structures extending in a first direction;
   forming impurity regions in the active region positioned at both sides of each of the conductive structures;
   conformally forming an interfacial layer on the substrate in contact with the conductive structures; and
   forming a first insulation layer on the interfacial layer,
   wherein each of the conductive structures is formed to include a gate insulation layer, a gate electrode, a silicide pattern and a capping pattern which are sequentially stacked,
   wherein the first insulation layer is formed using a flowable chemical vapor deposition (CVD) process, and
   wherein the interfacial layer reduces a tensile stress generated at an interface between the conductive structures and the first insulation layer while the first insulation layer is formed.

9. The method of claim 1, further comprising:
   patterning the first insulation layer and the interfacial layer to form contact holes exposing the active regions between the conductive structures; and
   forming contact plugs in respective ones of the contact holes.

10. A method of fabricating a semiconductor device, the method comprising:
    defining active regions in a substrate;
    forming conductive structures on the substrate that extend, in a first direction, across at least two of the active regions;
    prior to formation of the conductive structures, forming trenches in the substrate to extend in a second direction intersecting the active regions;
    prior to formation of the conductive structures, forming buried gate patterns in respective ones of the trenches;
    conformally forming an interfacial layer in contact with the conductive structures;
    forming a first insulation layer on the interfacial layer, wherein the first insulation layer is formed using a flowable material; and
    treating the first insulation layer to increase a density of the first insulation layer with the interfacial layer present between the first insulation layer and the conductive structure.

11. The method of claim 10, wherein during treating the first insulation layer, the interfacial layer reduces a tensile stress generated at an interface between the conductive structures and the first insulation layer while the first insulation layer is formed.

12. The method of claim 10, wherein the interfacial layer reduces a tensile stress generated at an interface between the conductive structures and the first insulation layer while the first insulation layer is formed.

13. The method of claim 10, wherein treating the first insulation layer comprises curing and then annealing the first insulation layer.

14. The method of claim 10:
- wherein conformally forming the interfacial layer comprises forming using an atomic layer deposition (ALD) process; and
- wherein forming the first insulation material is performed using a flowable chemical vapor deposition (CVD) process.

* * * * *